(12) United States Patent
Nakajima et al.

(10) Patent No.: US 8,383,522 B2
(45) Date of Patent: Feb. 26, 2013

(54) MICRO PATTERN FORMING METHOD

(75) Inventors: Shigeru Nakajima, Yamanashi (JP);
Kazuhide Hasebe, Yamanashi (JP);
Pao-Hwa Chou, Yamanashi (JP);
Mitsuaki Iwashita, Yamanashi (JP);
Reiji Niino, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 15 days.

(21) Appl. No.: 13/154,728

(22) Filed: Jun. 7, 2011

(65) Prior Publication Data
US 2011/0237082 A1 Sep. 29, 2011

Related U.S. Application Data

(62) Division of application No. 12/441,754, filed on Mar. 18, 2009, now Pat. No. 7,989,354.

(30) Foreign Application Priority Data

Jun. 8, 2007 (JP) ................................. 2007-153184

(51) Int. Cl.
*H01L 21/302* (2006.01)
*H01L 21/461* (2006.01)

(52) U.S. Cl. . 438/725; 438/197; 438/513; 257/E21.014; 257/E21.027; 257/E21.051; 257/E21.058; 257/E21.077; 257/E21.231; 257/E21.267; 257/E21.293; 257/E21.311; 257/E21.492

(58) Field of Classification Search ............... 438/725, 438/197, 513, 622, 142, 509, 671, 723, 724, 438/769; 257/E21.014, E21.027, E21.051, 257/E21.058, E21.077, E21.23, E21.267, 257/E21.278, E21.293, E21.311, E21.492
See application file for complete search history.

(56) References Cited

U.S. PATENT DOCUMENTS

| | | | |
|---|---|---|---|
| 6,365,428 B1 | 4/2002 | Zubrzycki et al. | |
| 7,151,039 B2 | 12/2006 | Lee et al. | |
| 7,736,926 B2 | 6/2010 | Yagi | |
| 7,989,354 B2 * | 8/2011 | Nakajima et al. | 438/725 |
| 8,168,375 B2 * | 5/2012 | Nakajima et al. | 430/317 |
| 2007/0253456 A1 | 11/2007 | Yagi | |

FOREIGN PATENT DOCUMENTS

| | | |
|---|---|---|
| JP | 04-196321 A | 7/1992 |
| JP | 09-205081 A | 8/1997 |
| JP | 2004-080033 A | 3/2004 |
| KR | 10-0206597 B1 | 4/1999 |
| KR | 10-2004-0016779 A | 2/2004 |
| KR | 10-2005-0028781 A | 3/2005 |
| KR | 10-2007-0003336 A | 1/2007 |

OTHER PUBLICATIONS

Korean Office action for 10-2011-7021227 dated Dec. 20, 2011.
Kim, "Current Status and Prospect of a Batch-Type ALD Apparatus", CERAMIST vol. 9, No. 4, pp. 45-51, Aug. 2006.
International Search Report for PCT/JP2008/060482 dated Jul. 1, 2008.
Korean Office action for 10-2011-7004101 dated Apr. 5, 2011.
U.S. Office action for U.S. Appl. No. 12/441,754 dated Dec. 9, 2010.

* cited by examiner

*Primary Examiner* — David Nhu
(74) *Attorney, Agent, or Firm* — Pearne & Gordon LLP

(57) ABSTRACT

There is provided a micro pattern forming method including forming a thin film on a substrate; forming a film serving as a mask when processing the thin film; processing the film serving as a mask into a pattern including lines having a preset pitch; trimming the pattern including the lines; and forming an oxide film on the pattern including the lines and on the thin film by alternately supplying a source gas and an activated oxygen species. Here, the process of trimming the pattern and the process of forming an oxide film are consecutively performed in a film forming apparatus configured to form the oxide film.

18 Claims, 18 Drawing Sheets

| IMPURITIES | O₂ GAS PLASMA | O₃ GAS |
|---|---|---|
| C | 1 | 20 |
| N | 1 | 8 |

MICRO PATTERN FORMING METHOD

CROSS-REFERENCE TO RELATED APPLICATION

This application is a divisional of U.S. application Ser. No. 12/441,754 filed on Mar. 18, 2009, U.S. Pat. No. 7,989,354, which claims the benefit of Japanese Patent Application No. 2007-153184, filed on Jun. 8, 2007. The entire disclosures of which are incorporated herein by reference.

FIELD OF THE INVENTION

The present invention relates to a patterning method for use in a semiconductor manufacturing process, for forming a pattern below or equal to a resolution limit of an exposure apparatus.

BACKGROUND OF THE INVENTION

Along with the trend for high integration of a semiconductor device, a wiring width or an isolation width required for a manufacturing process thereof is being miniaturized. In general, formation of a micro pattern involves forming a resist pattern by using a photolithography technique; and then etching various kinds of underlying thin films by using the resist pattern as an etching mask.

To form the micro pattern, the photolithography technique is important. However, the recent miniaturization of the semiconductor device has progressed to the extent that a dimension no greater than a resolution limit of the photolithography technique is required.

An example technique for forming the pattern no greater than the resolution limit is disclosed in Patent Document 1.

In Patent Document 1, a first photosensitive film pattern (hereinafter, referred to as "first resist pattern") is formed, and the first resist pattern is baked, and then an oxide film is formed on the first resist pattern. Subsequently, a second photosensitive film pattern (hereinafter, referred to as "second resist pattern") is formed between the first resist patterns, and a micro pattern is formed by etching an underlying thin film using the first and second resist patterns as an etching mask.

According to Patent Document 1, since the micro pattern is formed by using two exposure masks, it is possible to obtain a resolution two times or more than a case in which a micro pattern is formed by using one exposure mask. For this reason, it is possible to form the micro pattern below or equal to a resolution limit.

Further, a technique of forming an oxide film on a resist pattern is disclosed in Patent Document 2, for example.

In Patent Document 2, a method of forming a micro pattern below a resolution limit is not disclosed. However, disclosed is a technique in which an oxide film is formed on a resist pattern, so that a thinning phenomenon of the resist pattern can be avoided, and striation or wiggling can be prevented from occurring in the formed micro pattern.

Patent Document 1: Japanese Patent No. 2757983
Patent Document 2: Japanese Patent Laid-open Publication No. 2004-80033

According to Patent Document 1, it is possible to form a micro pattern no greater than a resolution limit. However, a demand for uniformity of a critical dimension (CD) of the micro pattern has gradually increased. For example, if a film thickness uniformity of an oxide film formed on a first resist pattern is not good, a CD control with respect to the micro pattern becomes difficult to achieve.

Disclosed in paragraph [0010] of Patent Document 2 is as follows, for example. It is desirable to form an oxide film at a temperature ranging from about normal temperature to 400° C. such that a resist pattern is prevented from being damaged, and this oxide film can be formed by using an atomic layer deposition method (ALD).

However, Patent Document 2 does not disclose a technique of forming the oxide film at a lower temperature than by the ALD and the oxide film having a uniform film thickness.

BRIEF SUMMARY OF THE INVENTION

An object of the present invention is to provide a patterning method allowing a better CD uniformity of a micro pattern having a pitch below or equal to a resolution limit.

In accordance with one aspect of the present disclosure, there is provided a micro pattern forming method including forming a thin film on a substrate; forming a film serving as a mask when processing the thin film; processing the film serving as a mask into a pattern including lines having a preset pitch; trimming the pattern including the lines; and forming an oxide film on the pattern including the lines and on the thin film by alternately supplying a source gas and an activated oxygen species. The process of trimming the pattern and the process of forming an oxide film are consecutively performed in a film forming apparatus configured to form the oxide film.

In accordance with another aspect of the present disclosure, there is provided a micro pattern forming method including forming a thin film on a substrate; forming a film serving as a first mask when processing the thin film; processing the film serving as a first mask into a first pattern including lines having a preset pitch; trimming the first pattern in a film forming apparatus configured to form an oxide film; as a following process of trimming the first pattern, forming an oxide film on the first pattern trimmed in the process of trimming the first pattern and on the thin film by alternately supplying a source gas and an activated oxygen species into the film forming apparatus; forming a film serving as a second mask on the oxide film; processing the film serving as a second mask into a second pattern including lines having a preset pitch; and trimming the second pattern. The thin film is processed by using, as masks, the first pattern on which the oxide film is formed and the trimmed second pattern.

In accordance with the present invention, it is possible to provide a patterning method allowing a better CD uniformity of a micro pattern having a pitch below or equal to a resolution limit.

DETAILED DESCRIPTION OF THE INVENTION

Hereinafter, embodiments of the present invention will be described in detail with reference to the accompanying drawings.

(First Embodiment)

FIGS. 1 to 7 provide cross sectional views to illustrate every major manufacturing process of a patterning method in accordance with a first embodiment of the present invention.

The first embodiment illustrates a basic processing sequence of the patterning method in accordance with the present invention.

Figure 1:
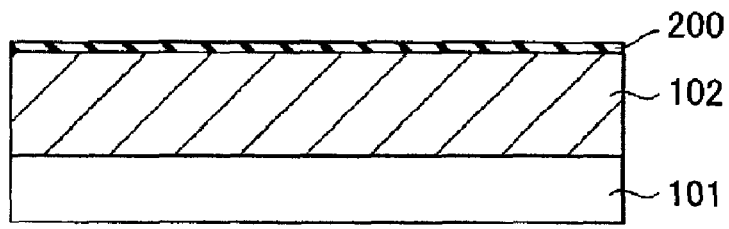
FIG. 1 is a cross sectional view to illustrate a major manufacturing process of a patterning method in accordance with a first embodiment of the present invention.

First, as shown in FIG. 1, a thin film 102 is formed on a semiconductor substrate 101. In the present specification, the semiconductor substrate 101 does not merely imply a semiconductor substrate, e.g., a silicon substrate, but includes a structure body having, in or on the semiconductor substrate, a semiconductor device, a conductive film corresponding to an integrated circuit pattern and an interlayer insulating film which insulates them. The thin film 102 is a film to be processed into a micro pattern later, and it may be an insulating film made of SiN or $SiO_2$, or a conductive film such as conductive polysilicon. In the present embodiment, the thin film 102 is made of, e.g., SiN. Then, a bottom anti-reflective material is coated on the thin film 102 to form a bottom anti-reflection coating (BARC) 200.

Figure 2:
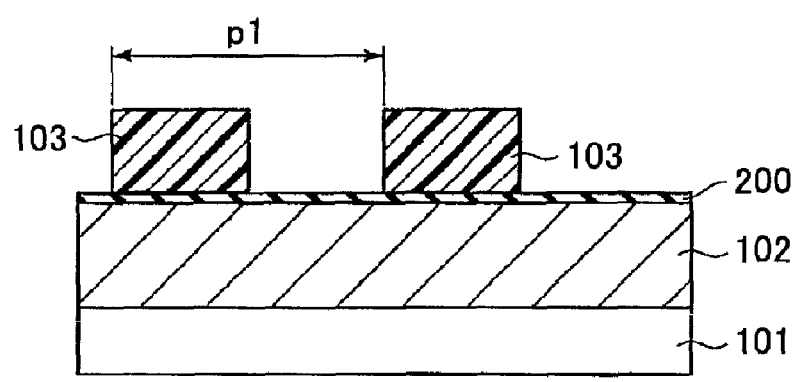
FIG. 2 is a cross sectional view to illustrate a major manufacturing process of the patterning method in accordance with the first embodiment of the present invention.

Subsequently, as illustrated in FIG. 2, a photoresist is coated on the bottom anti-reflection coating 200 so that a photoresist film is formed thereon. Then, by using a photolithography technique, the photoresist film is formed into a resist pattern 103 having a preset pitch p1. In the present embodiment, the resist pattern 103 has a line-and-space pattern, and the preset pitch p1 is set to be substantially equivalent to a resolution limit of an exposure apparatus.

Figure 3:
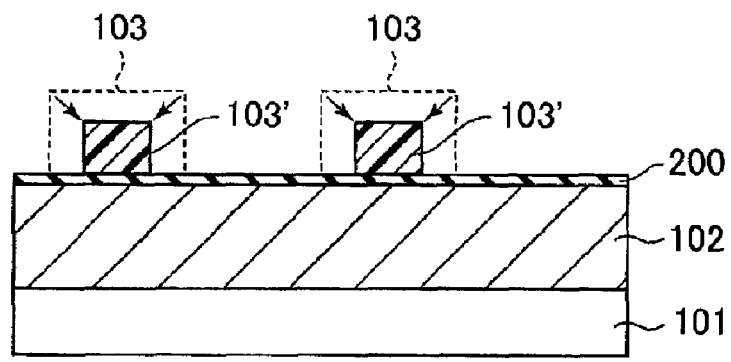
FIG. 3 is a cross sectional view to illustrate a major manufacturing process of the patterning method in accordance with the first embodiment of the present invention.

Then, as illustrated in FIG. 3, the resist pattern 103 is trimmed, thereby obtaining a trimmed resist pattern 103' (referred to as "first trimming process" in the present specification). The trimming process is performed, e.g., under an atmosphere containing oxygen radicals or ozone gas at a temperature ranging from about room temperature to 100° C.

Figure 4:
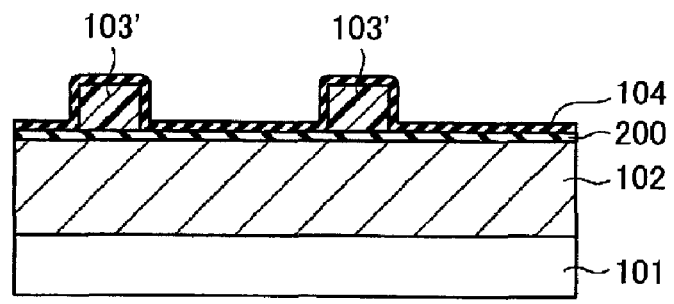
FIG. 4 is a cross sectional view to illustrate a major manufacturing process of the patterning method in accordance with the first embodiment of the present invention.

Thereafter, as illustrated in FIG. 4, on the trimmed resist pattern 103' and the bottom anti-reflection coating 200, formed is a silicon oxide film 104 different from the thin film 102, the bottom anti-reflection coating 200 and the resist pattern 103'. The silicon oxide film 104 is formed to protect the resist pattern 103' from a second photolithography process to be performed later. In the present specification, such a formation of the silicon oxide film 104 is referred to as a hardening process. In the present embodiment, the hardening process is performed by alternately supplying a source gas containing organic silicon and a gas containing an oxygen species such as oxygen radicals activated (excited) by plasma, thereby forming the silicon oxide film 104 on the trimmed resist pattern 103' and the bottom anti-reflection coating 200.

Figure 5:
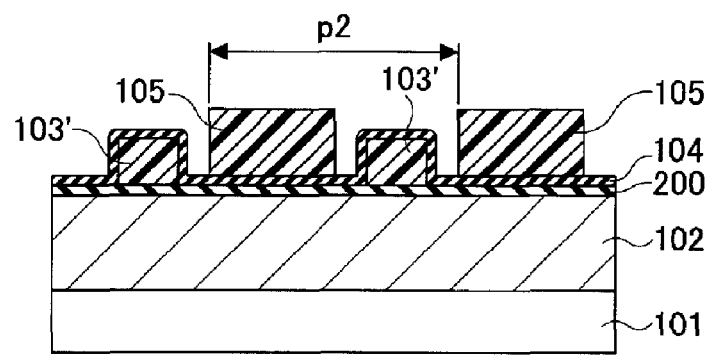
FIG. 5 is a cross sectional view to illustrate a major manufacturing process of a micro pattern forming method in accordance with the first embodiment of the present invention.

Then, as shown in FIG. 5, photoresist is coated on the silicon oxide film 104, so that a photoresist film is formed thereon. Then, by using the photolithography technique, the photoresist film is processed into a resist pattern 105 having a preset pitch p2. In the present embodiment, the resist pattern 105 has a line-and-space pattern like the trimmed resist pattern 103'. Further, the preset pitch p2 of the resist pattern 105 is set to be substantially equivalent to the resolution limit of the exposure apparatus. Furthermore, the resist pattern 105 of the present embodiment is disposed between the trimmed resist patterns 103', so that the resist pattern 103' and the resist pattern 105 are arranged alternately.

Figure 6:
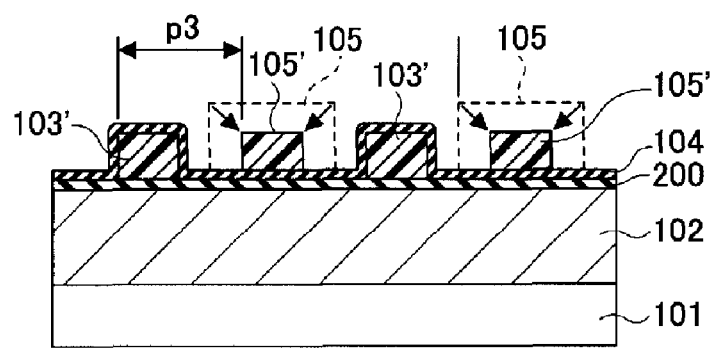
FIG. 6 is a cross sectional view to illustrate a major manufacturing process of the patterning method in accordance with the first embodiment of the present invention.

Subsequently, as illustrated in FIG. 6, the resist pattern 105 is trimmed, thereby obtaining a trimmed resist pattern 105' (referred to as "second trimming process" in the present specification). The trimming process can be performed, e.g., under an atmosphere containing oxygen radicals or ozone gas at a temperature ranging from about room temperature to 100° C. Through the second trimming process, there is formed a resist pattern including the resist patterns 103' and 105'. This resist pattern is disposed such that the patterns 103' and 105' are arranged alternately, so that its pitch p3 is narrower than the pitches p1 and p2, and in the present embodiment, it is almost one half of the pitches p1 and p2. In this manner, the resist patterns 103' and 105' formed separately are arranged alternately, so that it is possible to form the resist pattern having the pitch no greater than the resolution limit.

Figure 7:
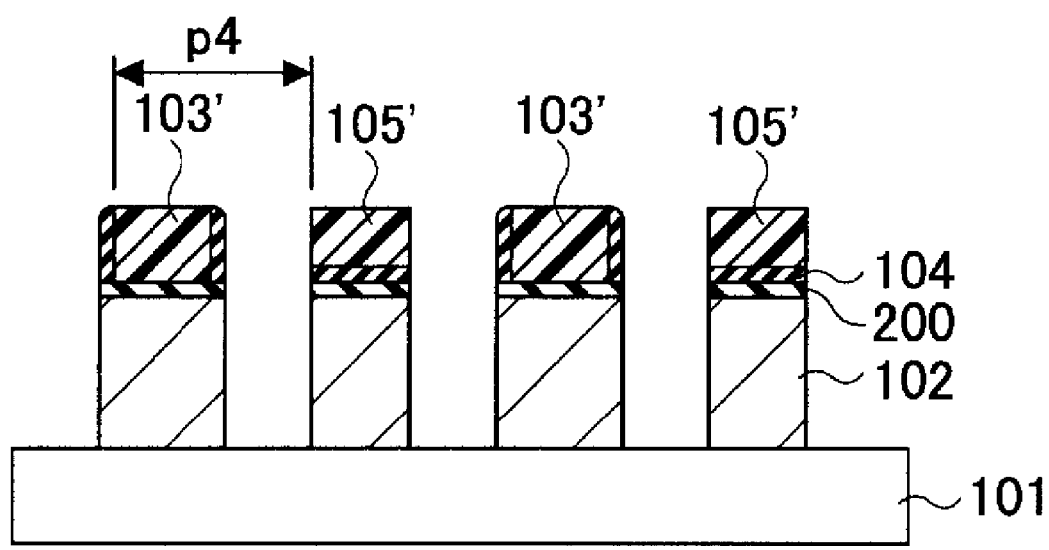
FIG. 7 is a cross sectional view to illustrate a major manufacturing process of the patterning method in accordance with the first embodiment of the present invention.

Thereafter, as illustrated in FIG. 7, the bottom anti-reflection coating 200, the silicon oxide film 104 and the thin film 102 are etched by using the resist patterns 103' and 105' as an etching mask, so that the thin film 102 is processed into a desired micro pattern. Since a pitch p4 of the processed thin film 102 becomes almost equal to the pitch p3 of the resist patterns 103' and 105', the pitch 4 of the micro pattern made of the thin film 102 can be set to be below or equal to the resolution limit. Therefore, in the first embodiment, it is possible to form the micro pattern having the pitch no greater than the resolution limit.

Furthermore, in the first embodiment, during the hardening process, the silicon oxide film 104 is formed on the bottom anti-reflection coating 200 and the trimmed resist pattern 103' by alternately supplying the source gas containing the organic silicon and the gas containing the oxygen species such as oxygen radicals excited by plasma, whereby a better CD uniformity of the micro pattern having the pitch no greater than the resolution limit can be obtained. Hereinafter, this film formation will be explained in detail.

Figure 8:
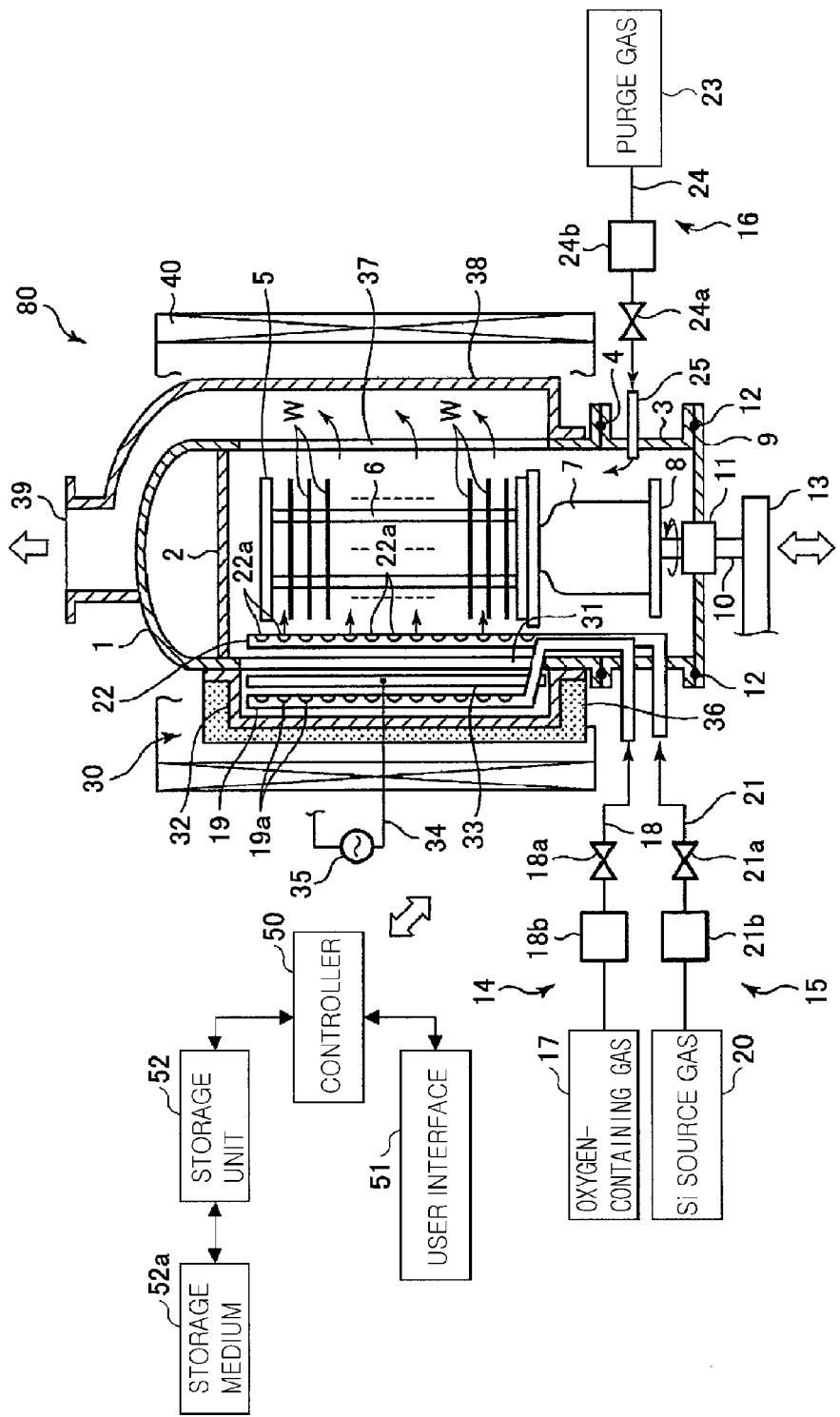
FIG. 8 is a longitudinal cross sectional view of an example of a film forming apparatus for use in the patterning method in accordance with the first embodiment of the present invention.
Figure 9:
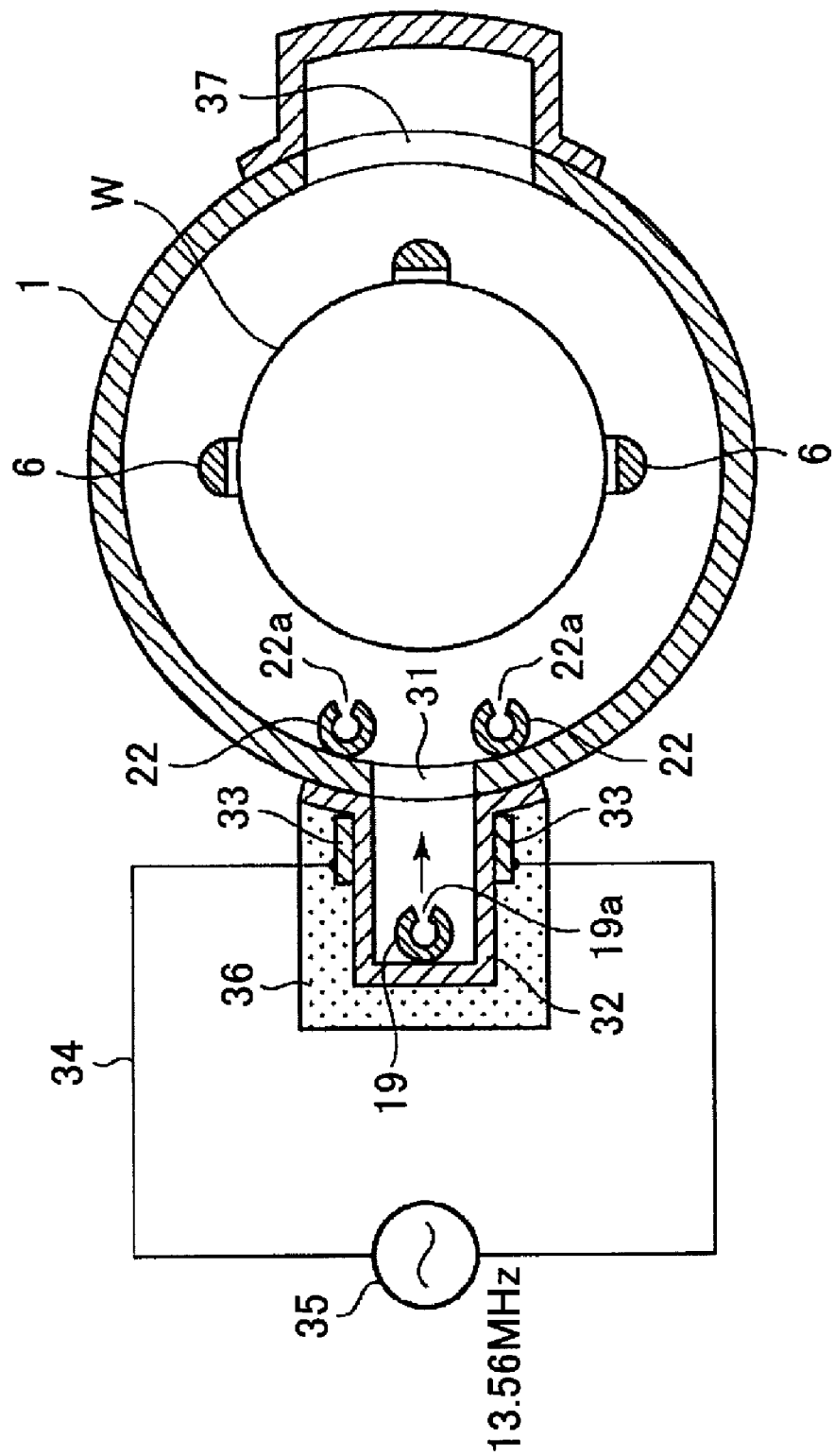
FIG. 9 is a transversal cross sectional view of an example of a film forming apparatus for forming a silicon oxide film 104.
Figure 10:
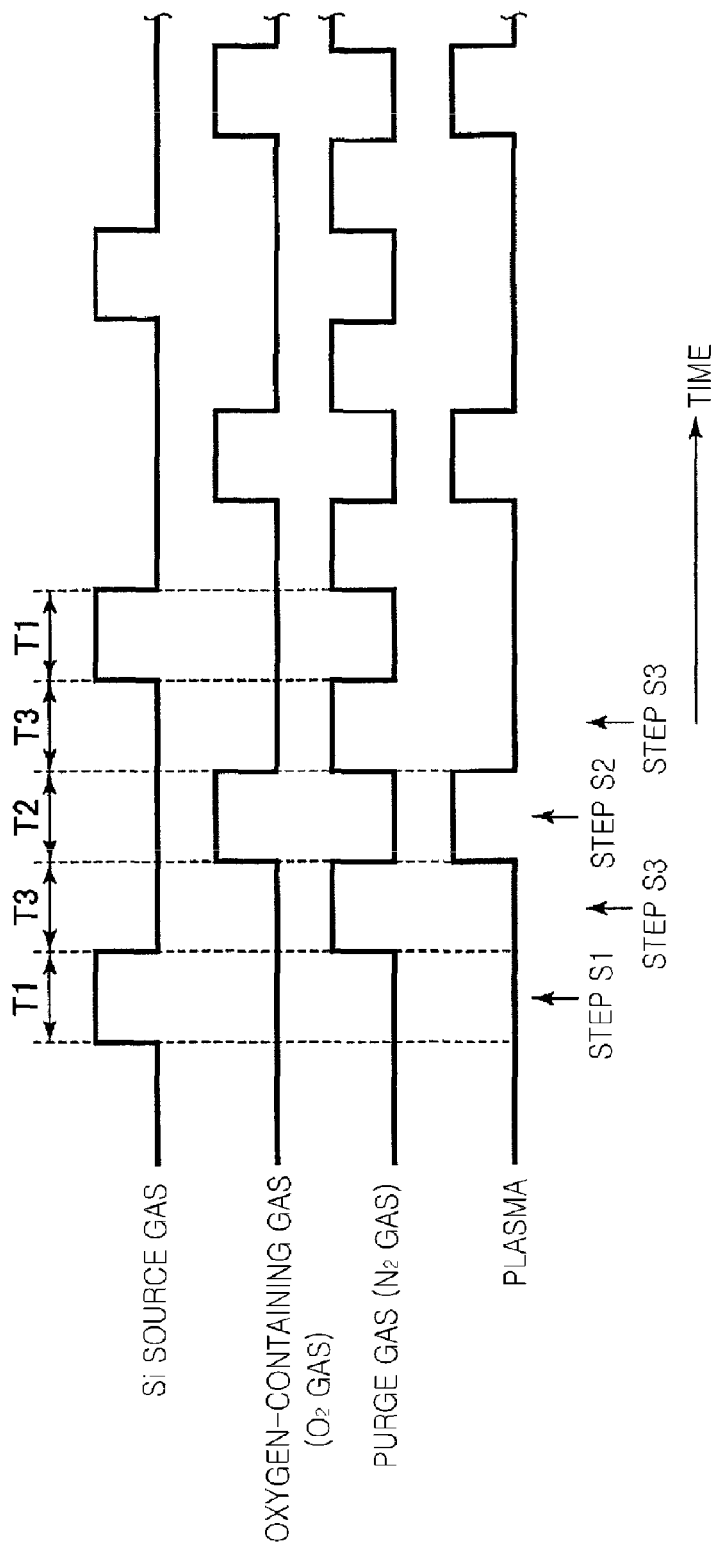
FIG. 10 is a timing chart for describing timing for a gas supply in a film forming method for forming the silicon oxide film 104.

FIG. 8 is a longitudinal cross sectional view illustrating an example of a film forming apparatus used to form the silicon oxide film 104, and FIG. 9 is a transversal cross sectional view of the film forming apparatus of FIG. 8. Further, FIG. 10 is a timing chart for the supply of the gases in the present embodiment. In FIG. 9, illustration of a heating unit is omitted.

As illustrated in FIGS. 8 and 9, a film forming apparatus 80 includes a cylinder shaped processing chamber 1 having a ceiling and an opened bottom. The entire processing chamber 1 is formed of, e.g., quartz, and a ceiling plate 2 made of quartz is installed and sealed airtightly in the ceiling inside the processing chamber 1. Further, a cylinder shaped manifold 3 made of, e.g., stainless steel is connected to the bottom opening portion of the processing chamber 1 through a sealing member 4 such as an O ring.

The manifold 3 supports the bottom of processing chamber 1, and a wafer boat 5, which is made of quartz and capable of accommodating therein a plurality of, e.g., about 50 to 100 sheets of semiconductor wafers W as target objects to be processed in multiple levels, can be inserted into the processing chamber 1 from below the manifold 3. The wafer boat 5 has three supporting columns 6 (see FIG. 9), and the plurality of wafers W are supported by grooves formed on the supporting columns 6.

The wafer boat 5 is mounted on a thermos vessel 7 made of quartz, and the thermos vessel 7 is mounted on a table 8. The table 8 is sustained on a rotational shaft 10 which penetrates a cover unit 9 made of, e.g., stainless steel, for opening and closing a bottom opening portion of the manifold 3.

Further, a magnetic fluid seal 11, for example, is installed at a penetrating portion of the rotational shaft to airtightly seal the rotational shaft 10 while supporting it rotatably. Further, disposed between the peripheral portion of the cover unit 9 and the lower end portion of the manifold 3 is a seal member 12 made of, e.g., an O ring, whereby the inside of the processing chamber 1 is maintained hermetically sealed.

The rotational shaft 10 is mounted on a leading end of an arm 13 supported on an elevation mechanism (not shown) such as a boat elevator. Thus, the wafer boat 5, the cover unit 9 and so forth are elevated to be loaded into the processing chamber 1 and moved down to be unloaded from the processing chamber 1 as one body. Further, it may be possible to fix the table 8 on the side of the cover unit 9 and perform the processing of the wafer W without rotating the wafer boat 5.

Furthermore, the film forming apparatus 80 includes an oxygen-containing gas supply unit 14 for supplying an oxygen-containing gas, e.g., an $O_2$ gas, into the processing chamber 1; a Si source gas supply unit 15 for supplying a Si source gas into the processing chamber 1; and a purge gas supply unit 16 for supplying a nonreactive gas, e.g., a $N_2$ gas into the processing chamber 1 as a purge gas.

In the present embodiment, a Si source gas containing organic silicon is used as the Si source gas for forming the silicon oxide film 104. An example of the Si source gas containing the organic silicon is an aminosilane-based precursor, and an example of the aminosilane-based precursor is a monovalent or divalent aminosilane-based precursor. Specifically, the monovalent or divalent aminosilane-based precursor may be, for example, bistertiarybutylaminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), butylaminosilane (BAS), diisopropylaminosilane (DIPAS), and bisethylmethylaminosilane (BEMAS). Further, one of the above-specified precursors or a combination of two or more of them may be used as the Si source gas containing the organic silicon.

Moreover, as the aminosilane-based precursor, a trivalent aminosilane-based precursor may be also utilized, and an example of the trivalent aminosilane-based precursor is tri-dimethylaminosilane (TDMAS).

Besides the aminosilane-based precursor, an ethoxysilane-based precursor can also be used as the Si source gas containing the organic silicon. The ethoxysilane-based precursor may be, for example, tetraethoxysilane (TEOS).

The oxygen-containing gas supply unit 14 includes an oxygen-containing gas supply source 17; an oxygen-containing gas pipe 18 for introducing an oxygen-containing gas from the oxygen-containing gas supply source 17; and an oxygen-containing gas dispersing nozzle 19 made of a quartz pipe connected with the oxygen-containing gas pipe 18, which is upwardly bent and vertically extended after penetrating the sidewall of the manifold 3 inwardly. A plurality of gas discharge holes 19a is provided at the vertically extended portion of the oxygen-containing gas dispersing nozzle 19 at a preset interval, whereby the oxygen-containing gas, e.g., the $O_2$ gas can be horizontally discharged toward the processing chamber 1 from each gas discharge hole 19a in a substantially uniform manner.

Further, the Si source gas supply unit 15 includes a Si source gas supply source 20; a Si source gas pipe 21 for introducing a Si source gas from the Si source gas supply source 20; and Si source gas dispersing nozzles 22 made of a quartz pipe connected with the Si source gas pipe 21, which are upwardly bent and vertically extended after penetrating the sidewall of the manifold 3 inwardly. Here, the number of the Si source gas dispersing nozzles 22 is two (see FIG. 9), and each Si source gas dispersing nozzle 22 has a multiplicity of gas discharge holes 22a provided along a lengthwise direction thereof at a predetermined interval. With this configuration, it is possible to discharge the Si source gas containing the organic silicon horizontally toward the processing chamber 1 from each gas discharge hole 22a in a substantially uniform manner. Further, it may be also possible to provide only one Si source gas dispersing nozzle 22.

Further, the purge gas supply unit 16 includes a purge gas supply source 23; a purge gas pipe 24 for introducing a purge gas from the purge gas supply source 23; and a purge gas nozzle 25 connected with the purge gas pipe 24 and penetrating the sidewall of the manifold 3. A non-reactive gas, e.g., a $N_2$ gas can be desirably used as the purge gas.

Opening/closing valves 18a, 21a and 24a and a flow rate controllers 18b, 21b, and 24b such as mass flow controllers are installed on the oxygen-containing gas pipe 18, the Si source gas pipe 21, and the purge gas pipe 24, respectively, so that the oxygen-containing gas, the Si source gas and the purge gas can be supplied while their flow rates are controlled respectively.

A plasma generation unit 30 has a plasma partition wall 32. The plasma partition wall 32 is airtightly installed at an outer wall of the processing chamber 1 to cover a thin and long opening 31 from outside, wherein the opening 31 is formed by scraping off a vertically elongated portion having a preset width in the sidewall of the processing chamber 1. Further, the plasma partition wall 32 has a cross section of a recess shape, and is formed thin and long vertically and is made of, e.g., quartz. In addition, the plasma generation unit 30 includes a pair of thin and long plasma electrodes 33 disposed on the outer surfaces of both sidewalls of the plasma partition wall 32 to face each other along a vertical direction; and a high frequency power supply 35 connected with the plasma electrodes 33 via a power supply line 34 to supply a high frequency power. By applying a high frequency voltage of, e.g., about 13.56 MHz outputted from the high frequency power supply 35 to the plasma electrodes 33, plasma of oxygen-containing gas can be generated. Further, the frequency of the high frequency voltage is not limited to 13.56 MHz, but a frequency of, e.g., about 400 kHz can be used instead.

By forming the plasma partition wall 32 as described above, a part of the sidewall of the processing chamber 1 has the recess shape which is recessed outwardly, and the inner space of the plasma partition wall 32 is allowed to intercommunicate with the inner space of the processing chamber 1 as one body. Further, the opening 31 has a height corresponding to the entire longitudinal direction of a region in which the wafers W are maintained in the wafer boat 5.

While extended upward inside the processing chamber 1, the oxygen-containing gas dispersing nozzle 19 is bent outward along a radial direction of the processing chamber 1 and is uprightly extended along the innermost portion inside the plasma partition wall 32 (i.e., a farthest portion from the center of the processing chamber 1). Accordingly, the oxygen-containing gas discharged from the gas discharge holes 19a is flown into the inner space of the processing chamber 1 after excited into the plasma by a high frequency electric field generated between the electrodes 33 as the high frequency power supply 35 is turned on.

An insulating protection cover 36 made of, e.g., quartz is installed at the outside of the plasma partition wall 32 to enclose it. Further, formed at an inner portion of the insulating protection cover 36 is a non-illustrated coolant path. By flowing, e.g., a cooled nitrogen gas through the coolant path, the plasma electrodes 33 can be cooled.

The two Si source gas dispersing nozzles 22 are uprightly located at both sides of the opening 31 inside the processing chamber 1. An aminosilane gas containing one or two amino groups in a single molecule can be discharged as the Si source gas from the multiplicity of gas discharge holes 22a formed at the Si source gas dispersing nozzles 22 toward the inner space of the processing chamber 1.

Meanwhile, installed at a processing chamber 1's portion opposite to the opening 31 is a gas exhaust opening for evacuating the inside of the processing chamber 1. The gas exhaust opening 37 is formed by removing a vertically long part of the sidewall of the processing chamber 1. A gas exhaust opening cover member 38 having a cross section of a recess shape is installed at a processing chamber 1's portion corresponding to the gas exhaust opening 37 by welding to cover the gas exhaust opening 37. The gas exhaust opening cover member 38 is upwardly extended along the sidewall of the processing chamber 1 and forms a gas outlet 39 above the processing chamber 1. The evacuation is carried out through this gas outlet 39 by an exhaust unit including a non-illustrated vacuum pump and the like. Further, a cylinder-shaped heating unit 40 for heating the processing chamber 1 and the wafers W therein is installed to surround the outer periphery of the processing chamber 1.

Control of each component of the film forming apparatus 80, for example, a supply/stop of each gas according to opening/closing operations of the valves 18a, 21a and 24a, a control of gas flow rates by the mass flow controllers 18b, 21b and 24b, a control of an on/off operation of the high frequency power supply 35, a control of the heating unit 40 and so forth are performed by a controller 50 made up of, e.g., a microprocessor (computer). Connected with the controller 50 is a user interface 51 including, for example, a keyboard with which a process manager performs, e.g., an input of a command to manage the film forming apparatus 80, a display for displaying an operational status of the film forming apparatus 80, and the like.

Furthermore, the controller 50 is connected to a storage unit 52 storing therein control programs to be used in implementing various processes performed by the film forming apparatus 80 under the control of the controller 50, and recipes, i.e., programs to be used in operating each unit of the film forming apparatus 80 according to processing conditions. The control programs or the recipes may be memorized in a storage medium 52a and then stored in the storage unit 52 from the storage medium 52a. The storage medium 52a may be a hard disk or a semiconductor memory, or can also be a portable storage medium such as a CD-ROM, a DVD, a flash memory, or the like. Alternatively, it is also possible to download the control programs or the recipes from another apparatus through, for example, a dedicated line to be stored in the storage unit 52.

Further, a necessary recipe is read from the storage unit 52 in response to an instruction from the user interface 51 or the like and is executed by the controller 50, whereby a desired process is performed in the film forming apparatus 80 under control of the controller 50.

Now, an example of a film forming method of the silicon oxide film 104, which is performed by the film forming apparatus having the above-described configuration, will be explained in conjunction with FIG. 10.

The wafer boat 5 accommodating therein, e.g., 50 to 100 sheets of wafers W is loaded into the processing chamber 1, which has been controlled at a preset temperature in advance by being elevated thereinto from below, and the inner space of the processing chamber 1 is sealed hermetically by closing the bottom opening portion of the manifold 3 with the cover unit 9. Each wafer W may have a diameter of, e.g., about 300 mm.

The inside of the processing chamber 1 is maintained at a preset processing pressure, and a wafer temperature is increased to and maintained at a processing temperature by controlling a power supplied to the heating unit 40, and the wafer boat 5 is rotated. In this state, a film forming process is begun.

An example of the film forming process is illustrated in FIG. 10. In the present example, though an aminosilane gas, e.g., BTBAS is used as the Si source gas containing the organic silicon, it is also possible to use another aminosilane gas or an ethoxysilane gas.

As can be seen from FIG. 10, in the present example of the film forming process, a step S1 for adsorbing an Si source by flowing the Si source gas containing the organic silicon into the processing chamber 1, and a step S2 for oxidizing the Si source gas by supplying a gas containing an oxygen species such as oxygen radicals formed by exciting the oxygen-containing gas into the processing chamber 1 are repeated alternately. Furthermore, in the present embodiment, a step S3 for exhausting a residual gas in the processing chamber 1 from the inside of the processing chamber 1 is performed between the steps S1 and S2.

Specifically, in the step S1 in the present example, an aminosilane gas, e.g., the BTBAS, having two amino groups in a single molecule, supplied from the Si source gas supply source 20 of the Si source gas supply unit 15 is discharged as the Si source gas into the processing chamber 1 through the gas discharge holes 22a via the Si source gas pipe 21 and the Si source gas dispersing nozzles 22 for a time period of T1. Accordingly, the Si source is adsorbed on the wafer W. The time period T1 ranges from about 1 to 60 seconds, for example. Further, the flow rate of the Si source gas may be set to be, for example, about 10 to 500 mL/min (sccm), and the internal pressure of the processing chamber 1 at this time may be set to be, for example, about 13.3 to 665 Pa.

In the step S2 for supplying the gas containing the oxygen species such as the oxygen radicals generated by the plasma, the oxygen-containing gas, e.g., the $O_2$ gas, supplied from the oxygen-containing gas supply source 17 of the oxygen-containing gas supply unit 14 is discharged from the gas discharge holes 19a via the oxygen-containing gas pipe 18 and the oxygen-containing gas dispersing nozzle 19. At this time, by turning on the high frequency power supply of the plasma generation unit 30, the high frequency electric field is generated, so that the oxygen-containing gas, e.g., the $O_2$ gas is excited into the plasma by the high frequency electric field. Then, the thus generated plasma of the oxygen-containing gas is supplied into the processing chamber 1. As a result, the Si source adsorbed in the wafer W is oxidized, so that $SiO_2$ is formed. A processing time T2 for this step ranges from, for example, about 5 to 300 seconds. Further, the flow rate of the oxygen-containing gas, though varied depending on the number of the wafers W sustained on the wafer boat 5, may be set to be about 100 to 20000 mL/min (sccm). Furthermore, the high frequency power supply 35 may be set to have a frequency of about 13.56 MHz and a power of about 5 to 1000 W. The internal pressure of the processing chamber 1 at this time may be set to be about 13.3 to 665 Pa.

In this case, a NO gas, a $N_2O$ gas, a $H_2O$ gas, or an $O_3$ gas can also be used as the oxygen-containing gas, and these gases are used as an oxidizing agent by being excited into the plasma by the high frequency electric field. Though the oxidizing agent is not limited to the plasma of the oxygen-containing gas but can be plasma of other various oxygen-containing gases, the $O_2$ plasma is most desirable. Particularly, by using the oxygen species including the oxygen radicals in the plasma of the $O_2$ gas, the $SiO_2$ film formation can be carried out at a temperature equal to or less than about 300° C. or even 100° C. and ideally even at a room temperature. Further, any one or more than one of the exemplified oxygen-containing gases can be used as the oxygen-containing gas.

Further, the step S3 performed between the steps S1 and S2 is a process for exhausting residual gases in the processing chamber 1 after the steps S1 and S2 to generate a desired reaction in a next step. The step S3 is performed by supplying the non-reactive gas, e.g., the $N_2$ gas, as the purge gas from the purge gas supply source 23 of the purge gas supply unit 16 via the purge gas pipe 24 and the purge gas nozzle 25, while evacuating the processing chamber 1. A processing time T3 for the step S3 ranges from, for example, about 1 to 60 seconds. Further, the flow rate of the purge gas may be set to be, for example, about 50 to 5000 mL/min (sccm). Moreover, the step S3 can be carried out by stopping the supply of all the gases and continuing the evacuation without supplying the purge gas as long as the residual gases in the processing chamber 1 can be exhausted. However, by supplying the purge gas, the residual gases in the processing chamber 1 can be exhausted out for a shorter period of time. Further, the internal pressure of the processing chamber 1 at this time may be set to be about 13.3 to 665 Pa.

In this way, by alternately and intermittently supplying the Si source gas and the $O_2$ plasma containing the oxygen species such as the oxygen radicals repetitively while performing the step S3 for removing the gases from the processing chamber 1 between the steps S1 and S2, thin layers of the $SiO_2$ film can be repetitively laminated on top of each other till a preset thickness is obtained.

Figure 11:
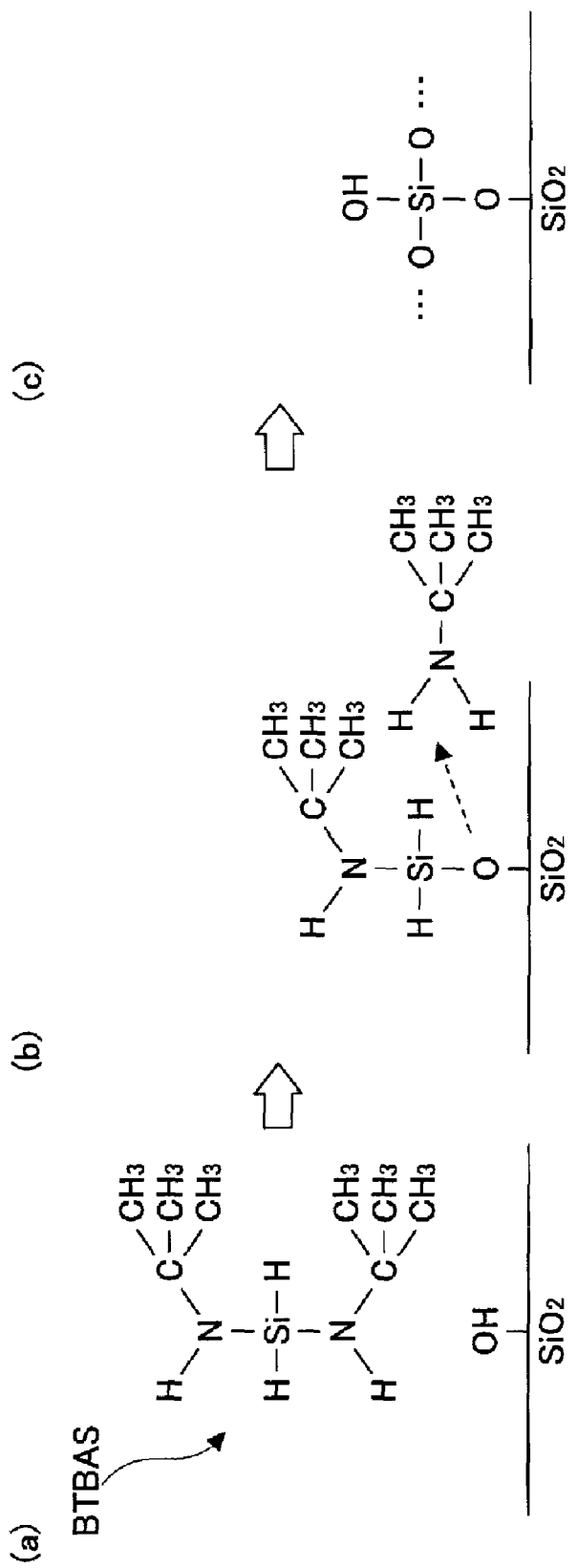
FIG. 11 provides a schematic diagram for describing a reaction which takes place when the film forming method of the silicon oxide film is performed.

An example of a reaction occurring at this time is illustrated in FIG. 11. FIG. 11 schematically shows the reaction example. The present reaction example is provided for the case of using the BTBAS as the Si source gas, for instance.

As illustrated in FIG. 11(a), an OH group exists on the surface of the previously deposited $SiO_2$ film, and the BTBAS, for example, is supplied thereto as the Si source. In the step (step S1) in which the Si source is adsorbed, a Si of the BTBAS combines with an oxygen atom of the OH group, so that a trimethylamino group is separated, as shown in FIG. 11(b). At this time, since the BTBAS, which is aminosilane having two amino groups, has a high reactivity with the OH and the amino groups are unlikely to become a structural obstacle to the reaction between the Si and the OH group, the adsorption reaction of the Si progresses rapidly. The separated trimethylamino group is exhausted from the processing chamber 1 through the step S3. Then, in a next oxidizing step (step S2), a Si compound left after the separation of the trimethylamino group is oxidized by the oxygen species including the oxygen radicals in the $O_2$ gas plasma, and thus becomes $SiO_2$ (on the surface thereof, however, H is adsorbed, so that an OH group is formed), as shown in FIG. 11(c). As described, unlike a genuine chemical reaction, the oxidation reaction using the oxygen species including the oxygen radicals in the $O_2$ gas plasma does not requires a high temperature, so that the reaction can take place at a low temperature.

The BTBAS is an aminosilane gas having the two amino groups in a single molecule, and is used as the Si source gas. Besides the BTBAS, BDEAS (bisdiethylaminosilane) and BDMAS (bisdimethylaminosilane) can also be used as such aminosilane gas.

Further, as the Si source gas, it may be also possible to use an aminosilane gas having three or more amino groups in a single molecule, or an aminosilane gas having a single amino group in a single molecule.

In accordance with the first embodiment, since the source gas containing the organic silicon, which is used as the Si source, and the oxygen species including the oxygen radicals contained in the $O_2$ gas plasma, with which the reaction in the oxidizing process can progress without having to increase the temperature, are alternately supplied, it is possible to form the $SiO_2$ film featuring a fine film property at about 100° C. or below, or even at a conventionally un-attempted low temperature such as a room temperature with a high film forming rate.

As described, in accordance with the present embodiment, though the film formation can be carried out at a very low temperature equal to or less than about 100° C. in principle, it is also possible to perform the film formation at a higher temperature than that. However, when considering the fact that the non-uniformity of film thickness increases with an increase of the film forming temperature along with the consideration of a thermal influence upon the resist pattern 103', it is most desirable to set the film forming temperature to be not greater than about 100° C.

Now, results of actually performing a film formation based on the first embodiment will be explained.

First, an experiment upon an oxidizing agent was carried out. A $SiO_2$ film was formed by alternately supplying BTBAS, which is used as a Si source gas, and $O_2$ gas plasma, which is used for an oxidizing process. Here, the step S1 was performed for 30 seconds by loading 100 sheets of 300 mm wafers into the processing chamber and setting a film forming temperature, a supply amount of the BTBAS and a pressure to be 100° C., 30 mL/min (sccm) and 53 Pa, respectively. Then, the step S2 was performed for 40 seconds by setting a supply amount of an $O_2$ gas and the pressure to be 2000 mL/min (sccm) and 665 Pa, respectively, while supplying a high frequency power of a frequency of 13.56 MHz at a power of 50 W. By performing 42 cycles of the steps 1 and 2, the $SiO_2$ film was formed. Further, to purge the inside of the processing chamber, a $N_2$ gas was supplied as a purge gas at a flow rate of 3500 mL/min (sccm) for 7 seconds before the step S1 and for 6 seconds before the step S2, respectively, while evacuating the processing chamber.

For comparison, a $SiO_2$ film was formed under the same conditions as described above excepting that an $O_3$ gas, without being excited into plasma, was supplied at a flow rate of 250 g/Nm³ as the oxidizing agent for the oxidizing process in the step S2.

As a result, based on the present embodiment, it was found that when using the oxygen species including the oxygen radicals in the $O_2$ gas plasma as the oxidizing agent, a film forming rate (speed) five times as high as that in case of using the $O_3$ gas without radicalizing oxygen can be obtained. Further, it was also found that non-uniformity in film thicknesses within a surface is very small when using the $O_2$ gas plasma.

Then, an experiment upon a film forming temperature was conducted.

Here, BTBAS was used as the Si source gas, and $O_2$ gas plasma was used for the oxidizing process, and a film formation was performed under the same conditions as described in the above experiment except the film forming temperature. The experiment was performed by varying the temperature from a room temperature (25° C.) to 75° C., 100° C., 200° C. and 300° C.

As a result, it was found that the film formation can be achieved at a low temperature no greater than 100° C. with a high film forming rate, and a sufficiently practical film formation can be achieved even at the room temperature. Moreover, it was also found that a high-uniformity film thickness can be obtained with a high film forming rate in a low temperature range below 100° C., especially, in a temperature range from 25° C. (room temperature) to 75° C. Further, it was also found that a temperature level no greater than 300° C. is desirable as the film forming temperature because non-uniformity of the film thickness increases if the film forming temperature exceeds 300° C. In particular, when performing the film formation on a resist pattern, it is desirable to set the temperature to be not greater than 100° C., as described earlier.

Then, the concentration of impurities during a hardening process was measured.

Here, concentrations of carbon (C) and nitrogen (N), which are used as impurities, in the case of performing a film formation by using $O_2$ gas plasma for the oxidizing process were compared with those in the case of performing the film formation by using an $O_3$ gas, wherein BTBAS was employed as the Si source gas in both cases. The measurement was carried out by employing a secondary ion mass spectrometry (SIMS).

Figures 12, 13:
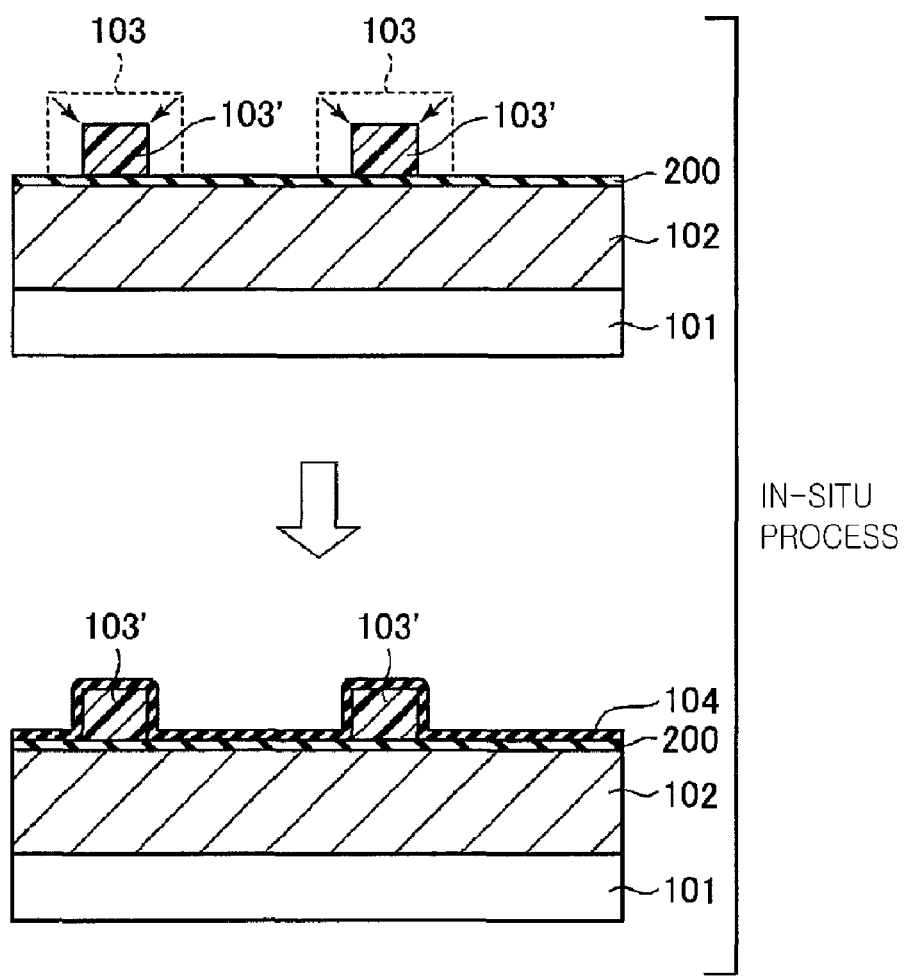
FIG. 12 is a table for comparing the amounts of impurities in respective cases of performing the film formation by using $O_2$ gas plasma and an $O_3$ gas.
FIG. 13 is a cross sectional view to illustrate a major manufacturing process of a patterning method in accordance with a second embodiment of the present invention.

The result is provided in FIG. 12. As can be seen from this figure, if the concentration of C and the concentration of N in the case of forming a film by using the $O_2$ gas plasma are respectively standardized as "1", the concentration of carbon (C) and the concentration of nitrogen (N) were found to be 20 times and 8 times greater in case that the film formation was carried out by using the $O_3$ gas. As found from this result, it is effective to perform the film formation by using the $O_2$ gas plasma during the hardening process in the aspect of removing the impurities. In general, a photoresist film is vulnerable to ammonia, and generation of ammonia is one of the causes for the occurrence of photoresist poisoning. To suppress the generation of ammonia, it is effective to suppress the generation of nitrogen (N). If the oxidizing process is performed by using the $O_2$ gas plasma, the generation amount of nitrogen (N) can be reduced, so that it becomes possible to suppress the photoresist poisoning. This is advantageous when applied to the hardening process.

As described above, in accordance with the first embodiment, it is possible to form the micro pattern having a pitch below or equal to the resolution limit. In addition, the silicon oxide film 104 can be formed at a very low temperature no greater than a heat resistant temperature of the resist pattern 103' with a high controllability of film thickness by alternately supplying the source gas containing the organic silicon and the gas containing the oxygen species such as the oxygen radicals generated by the plasma. Further, since the generation of nitrogen (N) is suppressed, it becomes possible to suppress the photoresist poisoning. As a result, the film thickness of the silicon oxide film 104 can be controlled at a molecular layer level and the CD control is facilitated, so that a good CD uniformity can be obtained.

The micro pattern of the thin film 102 thus obtained can be used as an integrated circuit pattern of a high density, such as a gate electrode of a transistor, a bit-line of a semiconductor memory, or the like.

(Second Embodiment)

FIG. 13 provides a cross sectional view to describe a major manufacturing process of a patterning method in accordance with a second embodiment of the present invention.

As illustrated in FIG. 13, in the second embodiment, the first trimming process and the hardening process as described in the first embodiment are performed consecutively in the same film forming apparatus (in-situ process).

The trimming process is performed by using an etching apparatus or an ashing apparatus, while the hardening process is performed by using a film forming apparatus. For this reason, in general, after the trimming process is finished, a semiconductor substrate (wafer) is taken out of the ashing apparatus first, and then transferred to the film forming apparatus.

In this manner, since the wafer is taken out of the apparatus after the trimming process, there is a possibility that dust or the like is adhered to a surface of a resist pattern 103'. If the dust or the like is adhered to the surface of the resist pattern 103', defect density of a silicon oxide film 104 formed on the resist pattern 103' is increased and film thickness uniformity thereof is easily deteriorated.

On the contrary, in accordance with the second embodiment, the trimming process is performed in the film forming apparatus, and also the trimming process and the hardening process are consecutively performed in the same film forming apparatus. Accordingly, the silicon oxide film 104 can be formed while maintaining the surface of the resist pattern 103' clean, so that the defect density thereof can be reduced and the film thickness uniformity thereof can be improved.

Further, two processes are consecutively performed in the same apparatus, so that a transfer time or a queuing time is reduced and the production efficiency is improved, thereby reducing the production cost.

Figure 14:
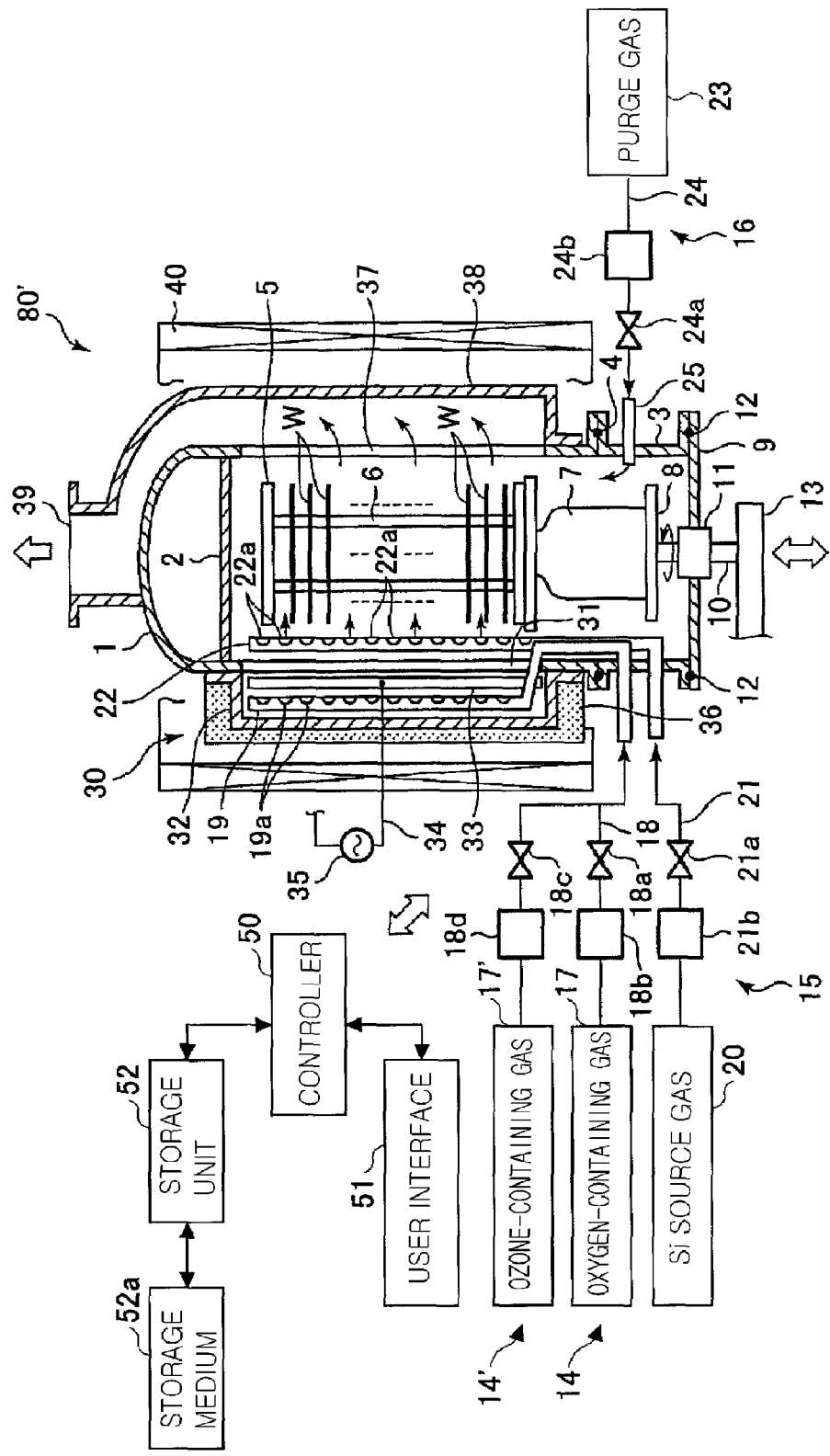
FIG. 14 is longitudinal cross sectional view of an example of a film forming apparatus for use in the patterning method in accordance with the second embodiment of the present invention.

Illustrated in FIG. 14 is an example of a film forming apparatus used for the patterning method in accordance with the second embodiment.

As illustrated in FIG. 14, a basic configuration of a film forming apparatus 80' used for the patterning method in accordance with the second embodiment is the same as the film forming apparatus 80 illustrated in FIG. 8. Particularly, it includes an oxygen-containing gas supply unit 14, a Si source gas supply unit 15 and a plasma generation unit 30, so that it is possible to perform a film formation in the same manner as the film formation of the silicon oxide film 104 described in the first embodiment.

Further, the film forming apparatus 80' includes an ozone-containing gas supply unit 14'. The ozone-containing gas supply unit 14' includes an ozone-containing gas supply source 17' which is connected with, e.g., an oxygen-containing gas pipe 18 via a flow rate controller 18d and an opening/closing valve 18c. With this configuration, it is possible to supply an ozone-containing gas to the inside of a processing chamber 1.

Used in the trimming process is the ozone-containing gas such as an ozone gas. When performing the trimming process by using the ozone gas, it may be possible not to generate plasma. Therefore, only the ozone-containing gas needs to be supplied into the processing chamber 1 through a dispersing nozzle 19 without applying a high frequency voltage to a plasma electrode 33 in the plasma generation unit 30, for example.

Since the film forming apparatus 80' illustrated in FIG. 14 includes the ozone-containing gas supply unit 14' in addition to the oxygen-containing gas supply unit 14, the Si source gas supply unit 15 and the plasma generation unit 30, after trimming the resist pattern 103 by using the ozone-containing gas in the processing chamber 1, the silicon oxide film 104 can be formed in the same processing chamber 1 by alternately supplying a source gas containing organic silicon and a gas containing an oxygen species such as the oxygen radicals generated by plasma. Accordingly, it is possible to form the silicon oxide film 104 in the same manner as the first embodiment while maintaining the surface of the resist pattern 103' clean, so that the defect density of the silicon oxide film 104 can be reduced and the film thickness uniformity can be improved in comparison to the first embodiment.

(Third Embodiment)

FIGS. 15 to 23 provide cross sectional views to illustrate every major manufacturing process of a patterning method in accordance with a third embodiment of the present invention.

The third embodiment illustrates an example of the patterning method in accordance with the present invention which can be more appropriately applied to an actual semiconductor process.

Figure 15:
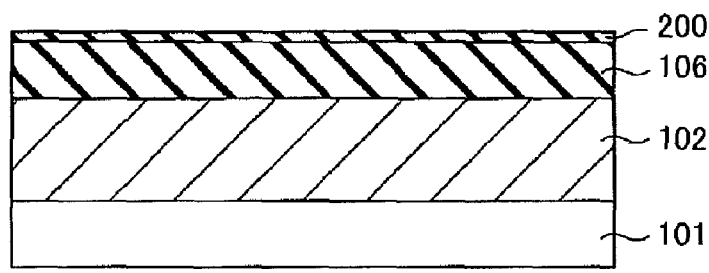
FIG. 15 is a cross sectional view to illustrate a major manufacturing process of a patterning method in accordance with a third embodiment of the present invention.

First, as illustrated in FIG. 15, a thin film 102, e.g., a conductive silicon film is formed on a semiconductor substrate 101, and then a hard mask film 106 is formed on the thin film 102 in the same manner as the first embodiment. The hard mask film 106 is made of a film different from the thin film 102 and is made of a film capable of obtaining an etching selectivity with respect to the thin film 102. For example, in case the thin film 102 is the conductive silicon film, a silicon nitride film may be selected as the hard mask film 106. Subsequently, a bottom anti-reflection coating 200 is formed on the hard mask film 106.

Figure 16:
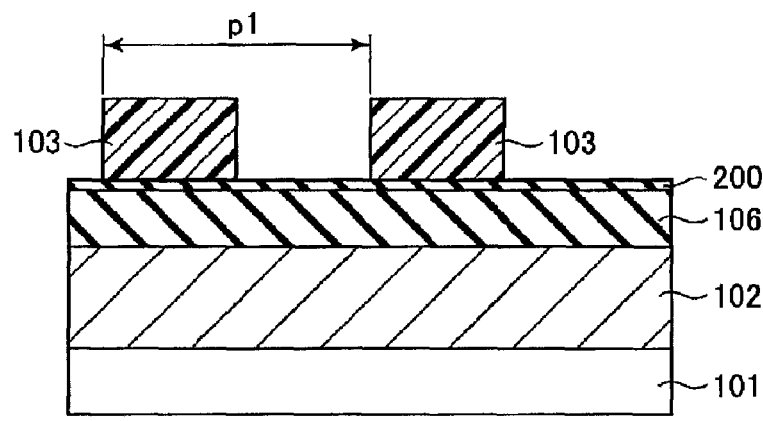
FIG. 16 is a cross sectional view to illustrate a major manufacturing process of the patterning method in accordance with the third embodiment of the present invention.

Thereafter, as illustrated in FIG. 16, photoresist is coated on the bottom anti-reflection coating 200, so that a photoresist film is formed thereon. Then, by using a photolithography technique, the photoresist film is processed into a resist pattern 103 having a preset pitch p1. In the present embodiment, like in the first embodiment, the resist pattern 103 has, for example, a line-and-space pattern and the preset pitch p1 is set to be substantially equivalent to a resolution limit of an exposure apparatus.

Figure 17:
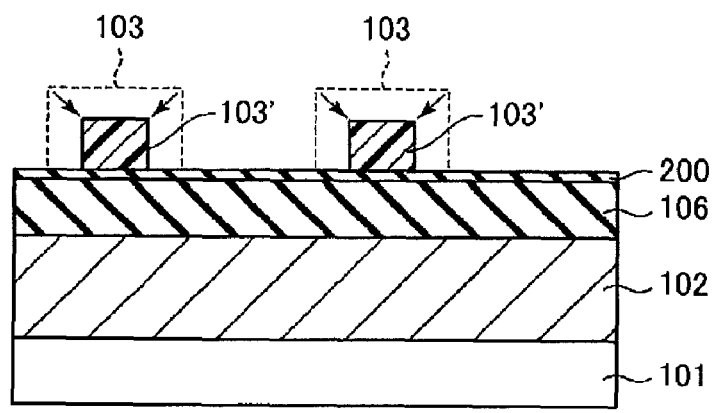
FIG. 17 is a cross sectional view to illustrate a major manufacturing process of the patterning method in accordance with the third embodiment of the present invention.

Then, as illustrated in FIG. 17, the resist pattern 103 is trimmed, thereby obtaining a trimmed resist pattern 103' (first trimming process). Conditions of the trimming process are the same as those of the first embodiment.

Figure 18:
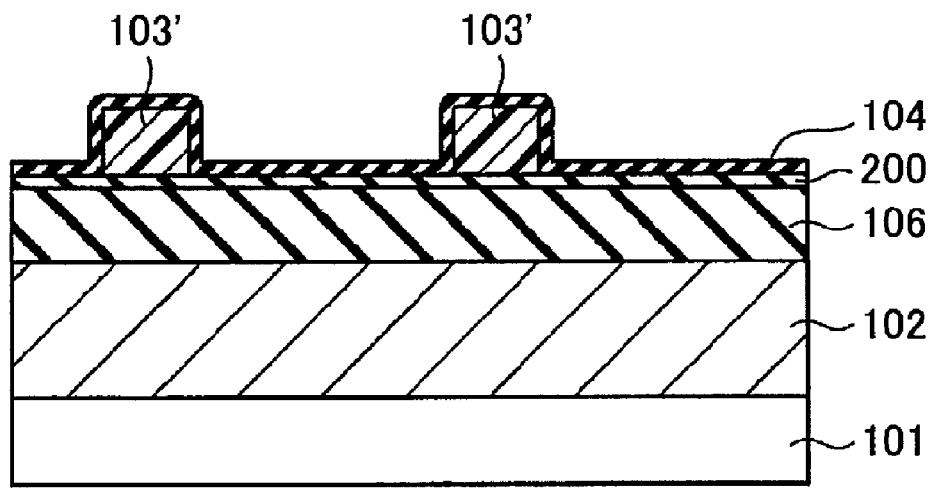
FIG. 18 is a cross sectional view to illustrate a major manufacturing process of the patterning method in accordance with the third embodiment of the present invention.

Subsequently, as illustrated in FIG. 18, a silicon oxide film 104 is formed on the trimmed resist pattern 103' and the bottom anti-reflection coating 200 (hardening process). In the third embodiment, the silicon oxide film 104 is formed by alternately supplying a source gas containing organic silicon and a gas containing an oxygen species such as oxygen radicals generated by plasma, in the same manner as the first embodiment.

Figure 19:
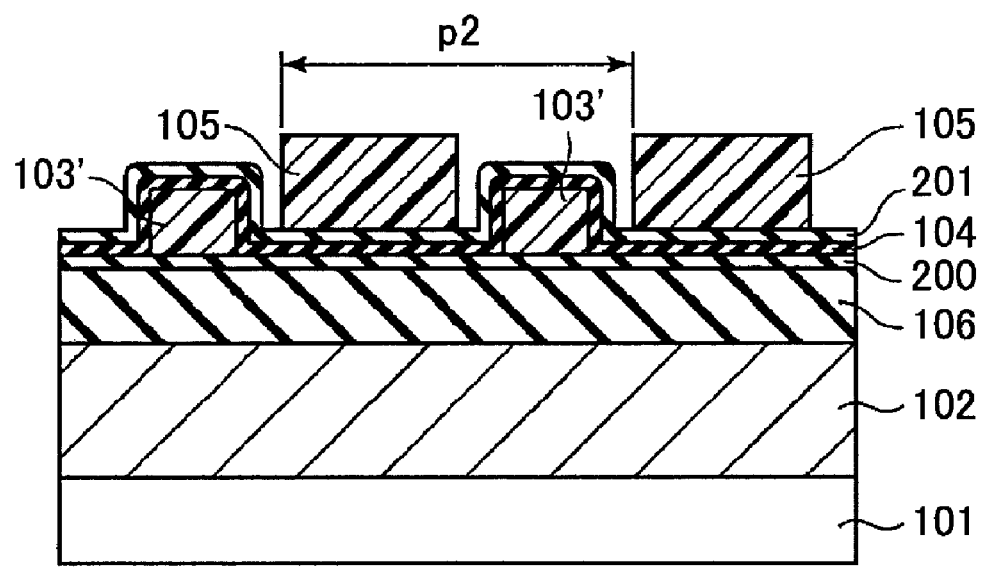
FIG. 19 is a cross sectional view to illustrate a major manufacturing process of the patterning method in accordance with the third embodiment of the present invention.

Then, as illustrated in FIG. 19, a bottom anti-reflection coating 201 is formed on the silicon oxide film 104. Subsequently, photoresist is coated on the bottom anti-reflection coating 201, so that a photoresist film is formed thereon. Then, by using the photolithography technique, the photoresist film is processed into a resist pattern 105 having a preset pitch p2. In the present embodiment, the resist pattern 105 has a line-and-space pattern like the trimmed resist pattern 103'. Further, the preset pitch p2 of the resist pattern 105 is set to be substantially equivalent to the resolution limit of the exposure apparatus. Further, the resist pattern 105 of the present embodiment is disposed between the trimmed resist patterns 103', so that the resist pattern 103' and the resist pattern 105 are arranged alternately.

Figure 20:
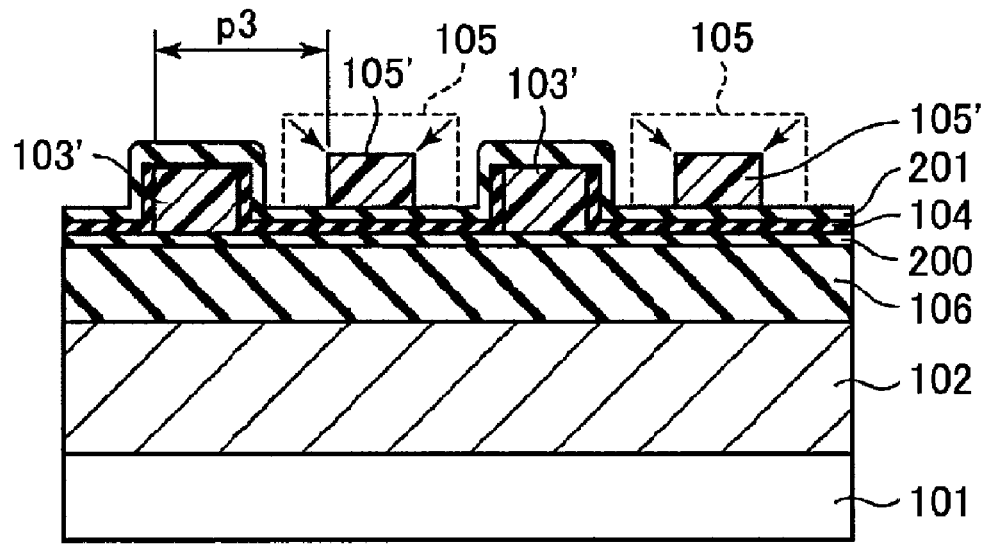
FIG. 20 is a cross sectional view to illustrate a major manufacturing process of the patterning method in accordance with the third embodiment of the present invention.

Next, as illustrated in FIG. 20, the resist pattern 105 is trimmed, so that a trimmed resist pattern 105' is obtained (second trimming process). Conditions of the trimming process are the same as those of the first embodiment. By the second trimming process, there is formed a resist pattern including the resist patterns 103' and 105' and having a pitch no greater than the resolution limit, in the same manner as the first embodiment.

Figure 21:
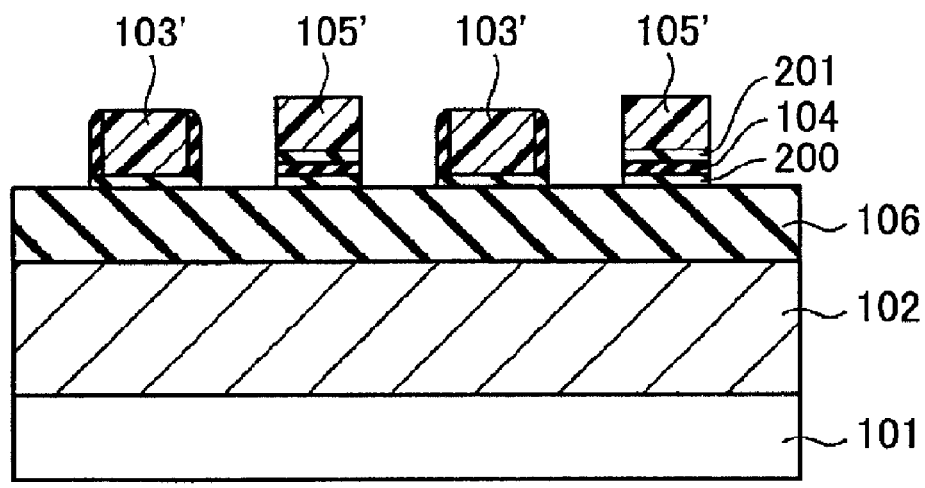
FIG. 21 is a cross sectional view to illustrate a major manufacturing process of the patterning method in accordance with the third embodiment of the present invention.
Figure 22:
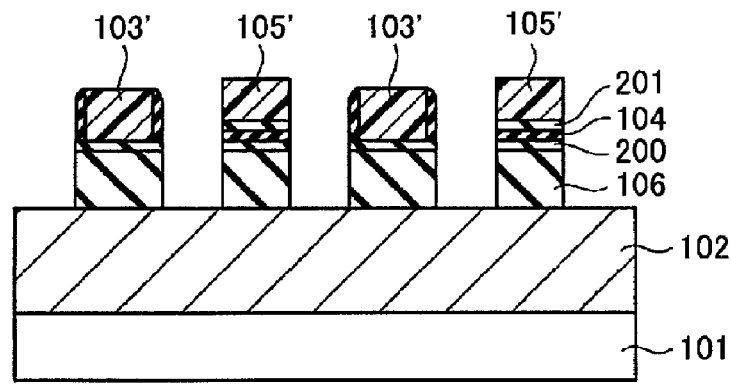
FIG. 22 is a cross sectional view to illustrate a major manufacturing process of the patterning method in accordance with the third embodiment of the present invention.

Thereafter, as shown in FIG. 21, the bottom anti-reflection coatings 201 and 200 and the silicon oxide film 104 are etched by using the resist patterns 103' and 105' as an etching mask, and as illustrated in FIG. 22, the hard mask film 106 is etched.

Figure 23:
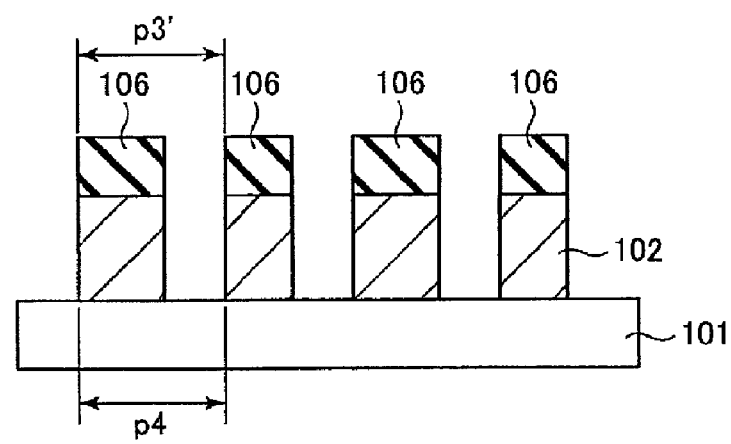
FIG. 23 is a cross sectional view to illustrate a major manufacturing process of the patterning method in accordance with the third embodiment of the present invention.

Subsequently, as illustrated in FIG. 23, after removing the bottom anti-reflection coatings 201 and 200, the silicon oxide film 104 and the resist patterns 103' and 105', the thin film 102 is etched by using the hard mask film 106 as an etching mask, and the thin film 102 is processed into a desired micro pattern. A pitch p3' of the hard mask film 106 is substantially equal to a pitch p3 of the resist patterns 103' and 105' and is set to be no greater than the resolution limit. Accordingly, a pitch p4 of the thin film 102, which is etched by using the hard mask film 106 as the etching mask, is below the resolution limit. In this manner, it is possible to form a micro pattern having a pitch no greater than the resolution limit in the third embodiment.

Also in the third embodiment, the silicon oxide film 104 is formed by alternately supplying the source gas containing the organic silicon and the gas containing the oxygen species such as the oxygen radicals excited by plasma, so that a CD uniformity of the micro pattern having the pitch no greater than the resolution limit can be more improved, like in the first embodiment.

Further, in accordance with the third embodiment, since the thin film 102 is etched by using the hard mask film 106 as the etching mask, it is possible to process the thin film 102 having a thickish film thickness in comparison to the case of performing the etching by using the resist patterns 103' and 105' as the etching mask.

Moreover, the third embodiment can be combined with the second embodiment, and the first trimming process (see FIG. 17) and the hardening process (see FIG. 18) can be consecutively performed in the same film forming apparatus. In this case, like in the second embodiment, since the silicon oxide film 104 can be formed while maintaining a surface of the resist pattern 103' clean, the film thickness uniformity of the silicon oxide film 104 can be further improved.

(Fourth Embodiment)

FIGS. 24A to 24I provide cross sectional views to illustrate every major manufacturing process of a patterning method in accordance with a fourth embodiment of the present invention.

Figure 24A:
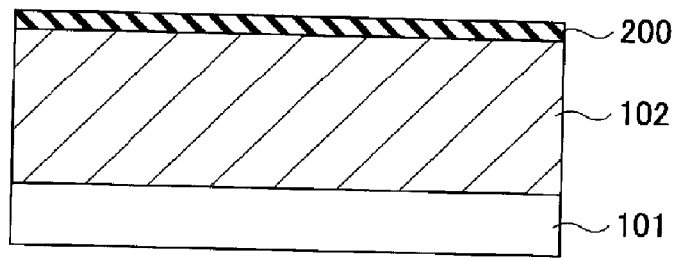
FIG. 24A is a cross sectional view to illustrate a major manufacturing process of a patterning method in accordance with a fourth embodiment of the present invention.

First, as illustrated in FIG. 24A, a thin film 102 is formed on a semiconductor substrate 101 in the same manner as the first embodiment. In the present specification, the semiconductor substrate 101 does not merely imply a semiconductor substrate, e.g., a silicon substrate, but includes a structure body having, in or on the semiconductor substrate, a semiconductor device, a conductive film corresponding to an integrated circuit pattern and an interlayer insulating film which insulates them. The thin film 102 is a film to be processed into a micro pattern later, and it may be an insulating film made of SiN or $SiO_2$, or a conductive film such as conductive polysilicon. In the present embodiment, the thin film 102 is made of, e.g., SiN. Then, a bottom anti-reflective material is coated on the thin film 102, so that a bottom anti-reflection coating (BARC) 200 is formed thereon.

Figure 24B:
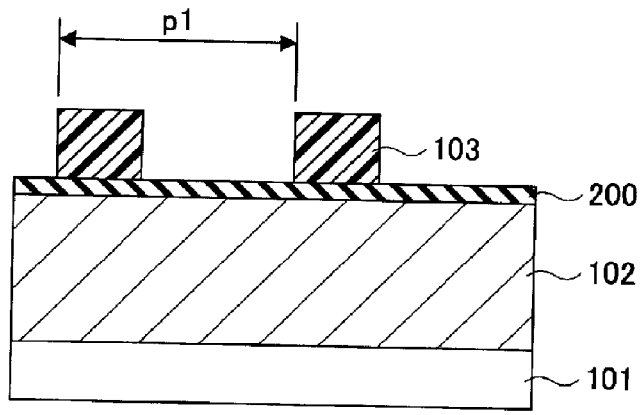
FIG. 24B is a cross sectional view to illustrate a major manufacturing process of the patterning method in accordance with the fourth embodiment of the present invention.

Subsequently, as illustrated in FIG. 24B, photoresist is coated on the bottom anti-reflection coating 200, so that a photoresist film is formed thereon. Then, by using a photolithography technique, the photoresist film is processed to obtain a resist pattern 103 having a preset pitch p1. In the present embodiment, the resist pattern 103 has a line-and-space pattern, and the preset pitch p1 is set to be substantially equivalent to a resolution limit of an exposure apparatus.

Figure 24C:
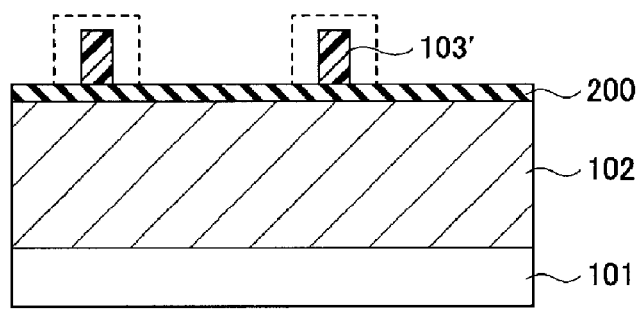
FIG. 24C is a cross sectional view to illustrate a major manufacturing process of the patterning method in accordance with the fourth embodiment of the present invention.

Then, as illustrated in FIG. 24C, the resist pattern 103 is trimmed, thereby obtaining a trimmed resist pattern 103' (referred to as "first trimming process" in the present specification). The trimming process is performed under an atmosphere containing, e.g., oxygen radicals or ozone gas at a temperature ranging from about room temperature to 100° C.

Figure 24D:
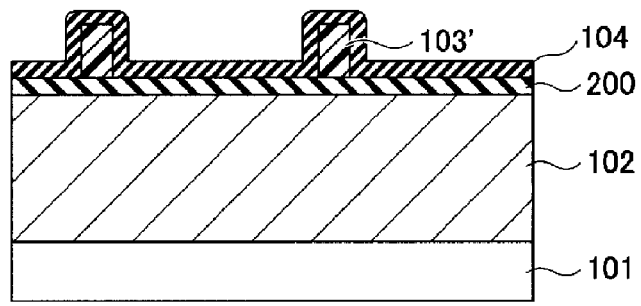
FIG. 24D is a cross sectional view to illustrate a major manufacturing process of the patterning method in accordance with the fourth embodiment of the present invention.

Thereafter, as illustrated in FIG. 24D, on the trimmed resist pattern 103' and the bottom anti-reflection coating 200, formed is a silicon oxide film 104 different from the thin film 102, the bottom anti-reflection coating 200 and the trimmed resist pattern 103' (hardening process). The silicon oxide film 104 can be formed by using the film forming apparatus 80 explained with reference to FIGS. 8 to 10 or by using the film forming apparatus 80' explained with reference to FIG. 14, in the same manner as the foregoing embodiments.

Figure 24E:
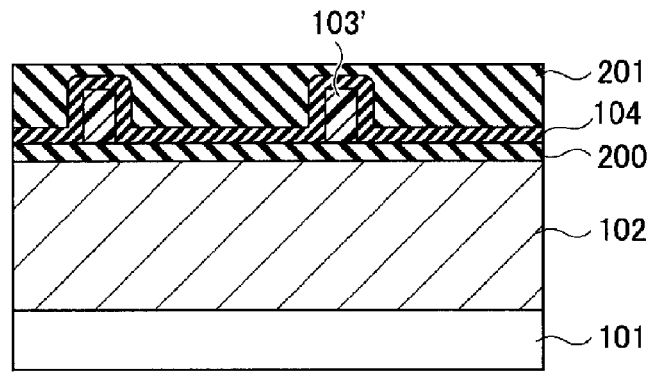
FIG. 24E is a cross sectional view to illustrate a major manufacturing process of the patterning method in accordance with the fourth embodiment of the present invention.

Next, as illustrated in FIG. 24E, a bottom anti-reflective material is coated on the silicon oxide film 104, so that a bottom anti-reflection coating (BARC) 201 is formed thereon. A thickness of the bottom anti-reflection coating 201 is sufficiently set so that its surface becomes substantially flat, whereby a height difference of the resist pattern 103' can be disregarded.

Figure 24F:
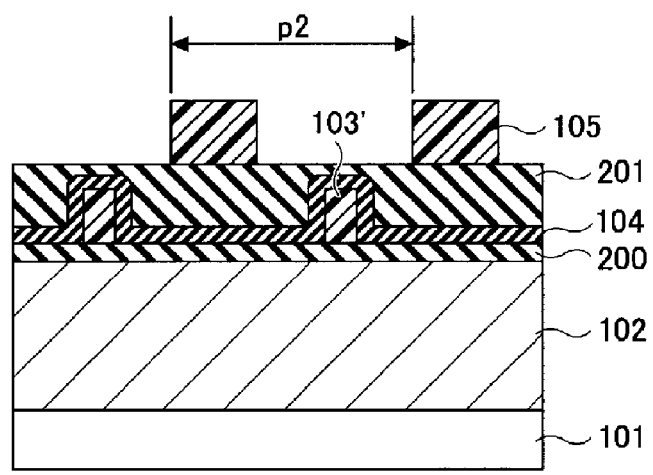
FIG. 24F is a cross sectional view to illustrate a major manufacturing process of the patterning method in accordance with the fourth embodiment of the present invention.

Subsequently, photoresist is coated on the bottom anti-reflection coating 201, so that a photoresist film is formed thereon. Then, as illustrated in FIG. 24F, by using a photolithography technique, the photoresist film is processed to form a resist pattern 105 having a preset pitch p2. In the present embodiment, the resist pattern 105 has a line-and-space pattern like the trimmed resist pattern 103'. Further, the preset pitch p2 of the resist pattern 105 is set to be substantially equivalent to the resolution limit of the exposure apparatus. Furthermore, the resist pattern 105 of the present embodiment is disposed between the trimmed resist patterns 103', so that the trimmed resist pattern 103' and the resist pattern 105 are arranged alternately.

Figure 24G:
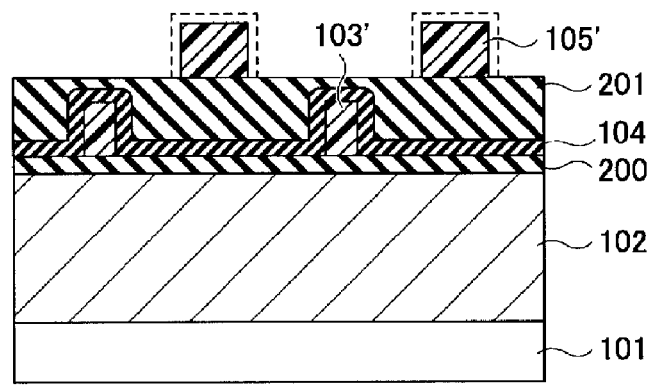
FIG. 24G is a cross sectional view to illustrate a major manufacturing process of the patterning method in accordance with the fourth embodiment of the present invention.
Figure 24H:
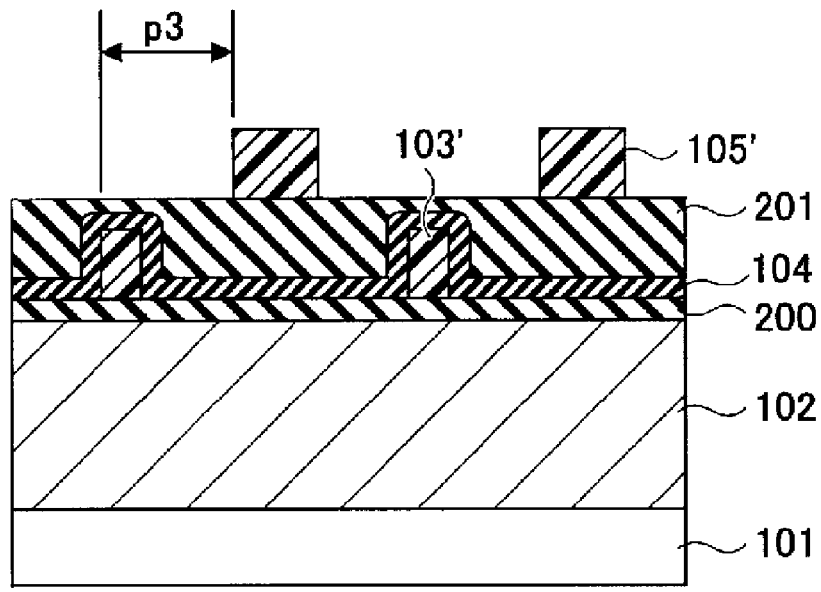
FIG. 24H is a cross sectional view to illustrate a major manufacturing process of the patterning method in accordance with the fourth embodiment of the present invention.

Then, a second trimming process is performed. That is, as illustrated in FIG. 24G, the resist pattern 105 is trimmed, thereby obtaining a trimmed resist pattern 105' (FIG. 24H). The trimming process can be performed under an atmosphere containing, e.g., oxygen radicals or ozone gas at a temperature ranging from about room temperature to 100° C. By the sequences explained till now, two resist patterns 103' and 105' are formed. These two resist patterns 103' and 105' actually function as a single resist pattern as described later. This resist pattern is disposed such that the patterns 103' and 105' are arranged alternately, so that its pitch p3 is narrower than the pitches p1 and p2, and in the present embodiment, it is approximately one half of the pitches p1 and p2. In this manner, by alternately arranging the resist patterns 103' and 105' formed separately, it is possible to form a resist pattern having a pitch no greater than the resolution limit.

Figure 24I:
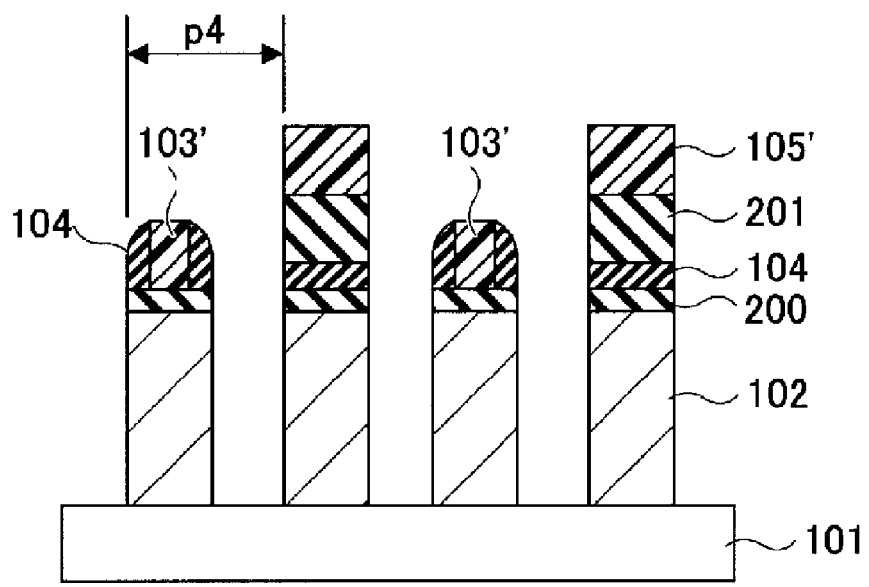
FIG. 24I is a cross sectional view to illustrate a major manufacturing process of the patterning method in accordance with the fourth embodiment of the present invention.

Thereafter, as illustrated in FIG. 24I, the bottom anti-reflection coatings 201 and 200, the silicon oxide film 104 and the thin film 102 are etched by using the resist patterns 103' and 105' as an etching mask, so that the thin film 102 is processed into a desired micro pattern. Since a pitch p4 of the processed thin film 102 becomes substantially equal to the pitch p3 of the resist patterns 103' and 105', the pitch 4 of the micro pattern made of the thin film 102 can be set to be below or equal to the resolution limit. In this manner, it is possible to form the micro pattern having the pitch no greater than the resolution limit, in the fourth embodiment.

Further, according to the micro pattern forming method in accordance with the fourth embodiment, since the bottom anti-reflection coating 201 having the thickness to the extent that its surface becomes flat is formed on the silicon oxide film 104 serving as a protective film of the resist pattern 103', it is possible to form, on the bottom anti-reflection coating 201, the resist pattern 105 (105') having a more apparent contour. Accordingly, etching accuracy in the etching of the thin film 102 by using the resist patterns 103' and 105' as mask layers can be improved as a whole.

Further, it should be noted that the present invention is not limited to the above-described embodiments, but can be modified in various ways. For example, though the above embodiments have been described for the case of applying the present invention to a batch type film forming apparatus which performs a film formation on a plurality of semiconductor wafers accommodated therein at one time, the present invention can also be applied to a single-wafer type film forming apparatus which performs a film formation on each sheet of a wafer. Further, the ethoxysilane gas and the aminosilane gas are not limited to the examples mentioned in the above embodiments. Further, though the oxidizing agent is exemplified by, e.g., the oxygen radicals generated as a result of exciting various oxygen-containing gases into plasma, any gases can be used without being limited to this example as long as they can generate oxygen species such as the oxygen radicals. Further, the aforementioned oxygen species can also be generated by activating oxygen molecules and the like as a result of irradiating laser beams or ultraviolet light (having a wavelength less than or equal to about 350 nm) to various oxygen-containing gases, not by the plasma. Furthermore, they can be generated by thermally activating the oxygen-containing gases.

Moreover, in the above-described embodiments, though the Si source gas and the gas containing the oxygen species excited by the plasma are supplied in the completely alternate manner, it is also possible to supply the gas containing the oxygen species activated (excited) by the plasma or the like when supplying the Si source gas.

Figure 25A:
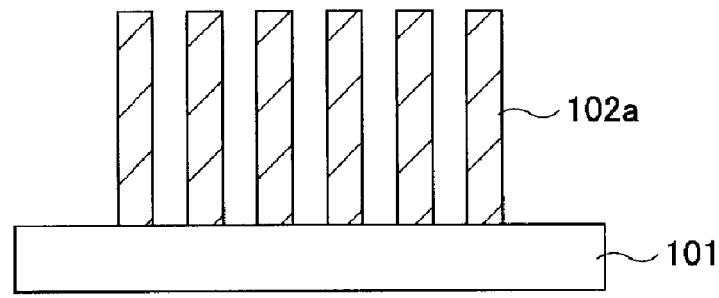
FIG. 25A is a cross sectional view to describe a semiconductor device manufacturing method capable of being performed subsequently to the patterning methods in accordance with the first to the third embodiments.
Figure 25B:
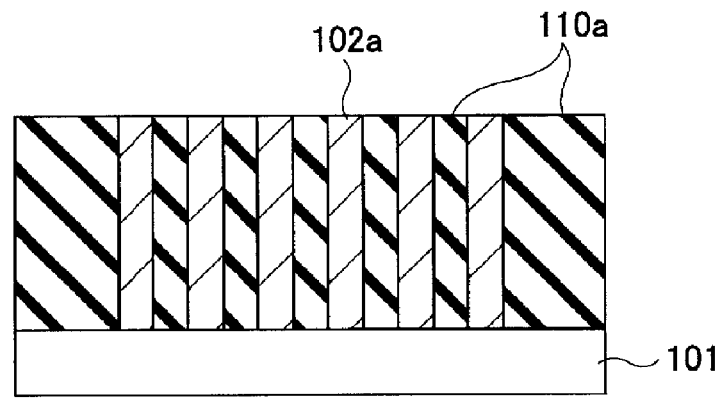
FIG. 25B is a cross sectional view to describe a semiconductor device manufacturing method capable of being performed subsequently to the patterning methods in accordance with the first to the third embodiments.

In addition, the patterning methods described in the above embodiments can be developed into a method for manufacturing a semiconductor device by continuing the following process. That is, if there is performed a step for removing the resist patterns 103' and 105' used as the etching mask after performing a step for obtaining the micro pattern by etching the thin film 102 (see FIGS. 7, 23 and 24I) in case that the thin film 102 as the target of the etching is made of an insulating material such as silicon oxide, silicon oxynitride, silicon nitride or the like, the micro pattern (hereinafter, referred to as "insulating film 102a" for the convenience of explanation) is left on the semiconductor substrate 101, as shown in FIG. 25A. Subsequently, if there are performed a step for filling gaps of the insulating film 102a with a semiconductor, e.g., silicon and a step for exposing the top surface of the insulating film 102a by planarizing the buried semiconductor, the insulating film 102a and silicon portions 110a are arranged alternately, as illustrated in FIG. 25B. Thus, it is possible to manufacture a semiconductor device in which the silicon portions 110a serve as a device region, while the insulating film 102a functions as a device isolation region. Furthermore, it may be also possible to perform a conduction control (control of a conduction type and/or conductivity) by adding certain impurities into the semiconductor when filling the gaps of the insulating film 102a. Moreover, it may be also possible to perform a step of burying a semiconductor instead of the step of removing the resist patterns 103' and 105', because the resist patterns 103' and 105' can be still removed in the planarizing step. However, removing the resist patterns 103' and 105' in advance is more desirable because it allows a reduction of an aspect ratio when filling the gaps of the insulating film 102a with the semiconductor.

Figure 26A:
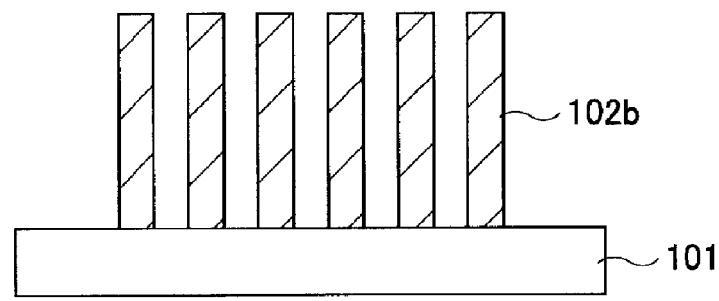
FIG. 26A is a cross sectional view to describe a semiconductor device manufacturing method capable of being performed subsequently to the patterning methods in accordance with the first to the third embodiments.
Figure 26B:
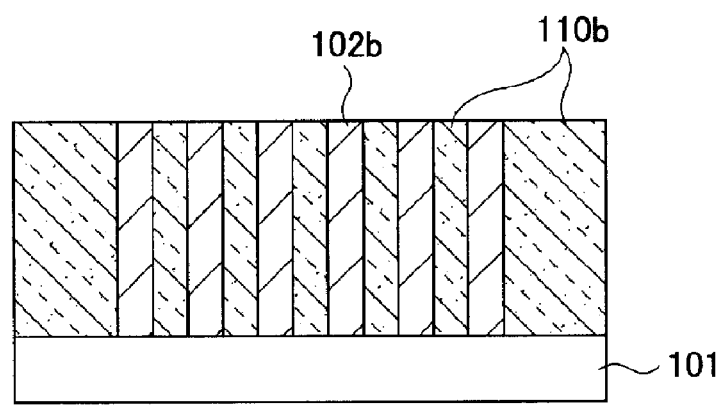
FIG. 26B is a cross sectional view to describe a semiconductor device manufacturing method capable of being performed subsequently to the patterning methods in accordance with the first to the third embodiments.

Furthermore, if there is performed a step for removing the resist patterns 103' and 105' used as the etching mask after performing a step for obtaining the micro pattern by etching the thin film 102 (see FIGS. 7, 23 and 24I) in case that the thin film 102 as the target of the etching is formed of a semiconductor, e.g., silicon, the micro pattern (hereinafter, referred to as "silicon film 102b" for the convenience of explanation) is left on the semiconductor substrate 101. Subsequently, if there are performed a step for filling gaps of the silicon film 102b with an insulating material such as silicon oxide, silicon oxynitride, silicon nitride or the like and a step for exposing the top surface of the silicon film 102b by planarizing the buried insulating material, the silicon film 102b and insulting portions 110b are arranged alternately, as illustrated in FIG. 26B. Thus, it is possible to manufacture a semiconductor device in which the silicon film 102b serves as a device region, while the insulating portions 110b function as a device isolation region. Furthermore, in case that the thin film 102 is made of the semiconductor, it may be also possible to perform a conduction control (control of a conduction type and/or conductivity) by previously adding certain impurities into the thin film 102 by ion implantation. Further, in case of forming the thin film 102 by CVD or the like, it may be also possible to perform a conduction control by adding impurities by using certain dopant gases. Moreover, it may be also possible to perform a step of burying an insulating material instead of the step of removing the resist patterns 103' and 105', because the resist patterns 103' and 105' can be still removed in the planarizing step. However, removing the resist patterns 103' and 105' in advance is more desirable because it allows a reduction of an aspect ratio when burying the gaps of the silicon film 102b with the insulating material.

Figure 27:
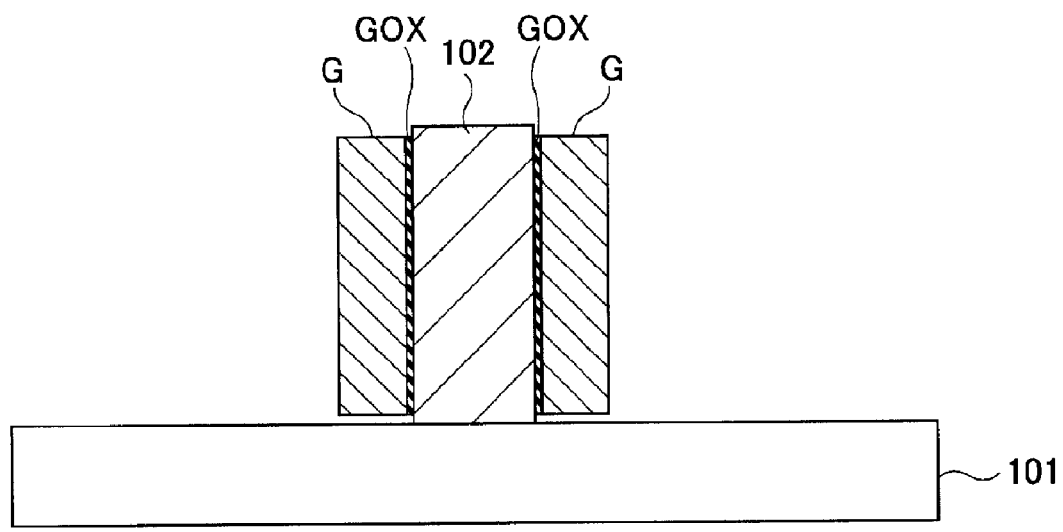
FIG. 27 is a cross sectional view showing an example of a semiconductor device, which can be manufactured by using the patterning methods in accordance with the first to the third embodiments.

Moreover, the patterning methods in accordance with the first to the third embodiments can be employed for the manufacture of a semiconductor device shown in FIG. 27. FIG. 27 is a cross sectional view of a so-called Fin type field effect transistor (FET) including a thin film 102 formed by any one of the patterning methods in accordance with the first to the third embodiments; insulating layers GOX formed to interpose the thin film 102 therebetween; and electrode layers G in contact with the insulating layers GOX. Since the thin film 102 having a narrower width than the resolution limit of an exposure apparatus for use in a photolithography process can be formed by the patterning methods in accordance with the embodiments of the present invention, the Fin type FET can be miniaturized, and integration density can be improved.

In addition, though the embodiments have been described for the case of embedding the plasma generation unit in the processing chamber as one body, the present invention is not limited thereto. That is, a remote plasma apparatus installed separately from the processing chamber and introducing previously generated plasma from the outside of the processing chamber therein can be used instead.

Furthermore, though the wafer boat 5 of the film forming apparatuses 80 and 80' has been described to be able to accommodate 50 to 100 sheets of wafers W, the number of the wafer W mounted therein is not limited to this range. For example, the film forming apparatuses 80 and 80' may have the wafer boat 5 capable of accommodating a relatively small number of, e.g., 2 to 15 sheets of wafers. Besides, the film forming apparatuses 80 and 80' may be configured as semi-batch (mini-batch) type film forming apparatuses designed to process the relatively small number of, e.g., 2 to 15 sheets of wafers.

In addition, the target object to be processed is not limited to the semiconductor wafer, but the present invention can be applied to other types of substrates, such as a LCD glass substrate and the like.

Further, though the bottom anti-reflection coatings 200 and 201 are formed before the formation of the photoresist film, the bottom anti-reflection coatings 200 and 201 may be formed when necessary.

Furthermore, the resist patterns 103' and 105' may be trimmed when necessary.

What is claimed is:

1. A micro pattern forming method comprising:
forming a thin film on a substrate;
forming a film serving as a mask when processing the thin film;
processing the film serving as a mask into a pattern including lines having a preset pitch;
trimming the pattern including lines; and
forming an oxide film on the pattern including the lines and on the thin film by alternately supplying a source gas and an activated oxygen species,
wherein the process of trimming the pattern and the process of forming an oxide film are consecutively performed in a film forming apparatus configured to form the oxide film.

2. The micro pattern forming method of claim 1,
wherein a resist film is used as the film serving as a mask.

3. The micro pattern forming method of claim 1,
wherein in the process of processing the film, the film is processed into the pattern including the lines having the preset pitch by photolithography.

4. The micro pattern forming method of claim 1,
wherein in the process of trimming the pattern, the pattern is trimmed by using oxygen-containing gas plasma or an ozone-containing gas.

5. The micro pattern forming method of claim 1,
wherein an aminosilane-based precursor is used as the source gas.

6. The micro pattern forming method of claim 5,
wherein the aminosilane-based precursor is a monovalent or divalent aminosilane-based precursor.

7. The micro pattern forming method of claim 6,
wherein the monovalent or divalent aminosilane-based precursor is at least one selected from bistertiarybutylaminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), butylaminosilane (BAS), diisopropylaminosilane (DIPAS), and bisethylmethylaminosilane (BEMAS).

8. The micro pattern forming method of claim 1,
wherein oxygen radicals excited by plasma are used as the activated oxygen species.

9. The micro pattern forming method of claim 8,
wherein the oxygen radicals excited by plasma are obtained by exciting at least one selected from an O2 gas, a NO gas, a N2O gas, a H2O gas and an O3 gas into plasma.

10. A micro pattern forming method comprising:
forming a thin film on a substrate;
forming a film serving as a first mask when processing the thin film;
processing the film serving as a first mask into a first pattern including lines having a preset pitch;
trimming the first pattern in a film forming apparatus configured to form an oxide film;
as a following process of trimming the first pattern, forming an oxide film on the first pattern trimmed in the process of trimming the first pattern and on the thin film by alternately supplying a source gas and an activated oxygen species into the film forming apparatus;
forming a film serving as a second mask on the oxide film;
processing the film serving as a second mask into a second pattern including lines having a preset pitch; and trimming the second pattern,
wherein the thin film is processed by using, as masks, the first pattern on which the oxide film is formed and the trimmed second pattern.

11. The micro pattern forming method of claim 10,
wherein resist films are used as the film serving as a first mask and the film serving as a second mask.

12. The micro pattern forming method of claim 10,
wherein in the process of processing the film serving as a first mask, the film is processed into the first pattern including the lines having the preset pitch by photolithography, and
in the process of processing the film serving as a second mask, the film is processed into the second pattern including the lines having the preset pitch by photolithography.

13. The micro pattern forming method of claim 10,
wherein in the process of trimming the first pattern, and the process of trimming the second pattern, the first pattern and the second pattern are trimmed by using oxygen-containing gas plasma or an ozone-containing gas.

14. The micro pattern forming method of claim 10,
wherein an aminosilane-based precursor is used as the source gas.

15. The micro pattern forming method of claim 14,
wherein the aminosilane-based precursor is a monovalent or divalent aminosilane-based precursor.

16. The micro pattern forming method of claim 15,
wherein the monovalent or divalent aminosilane-based precursor is at least one selected from bistertiarybutylaminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), butylaminosilane (BAS), diisopropylaminosilane (DIPAS), and bisethylmethylaminosilane (BEMAS).

17. The micro pattern forming method of claim 10,
wherein oxygen radicals excited by plasma are used as the activated oxygen species.

18. The micro pattern forming method of claim 17,
wherein the oxygen radicals excited by plasma are obtained by exciting at least one selected from an O2 gas, a NO gas, a N2O gas, a H2O gas and an O3 gas into plasma.

* * * * *

UNITED STATES PATENT AND TRADEMARK OFFICE
CERTIFICATE OF CORRECTION

PATENT NO. : 8,383,522 B2
APPLICATION NO. : 13/154728
DATED : February 26, 2013
INVENTOR(S) : Shigeru Nakajima et al.

It is certified that error appears in the above-identified patent and that said Letters Patent is hereby corrected as shown below:

On the Title page, Item [62] please delete "Division of application No. 12/441,754, filed on Mar. 18, 2009, now Pat. No. 7,989,354" and add -- Division of application No. 12/441,754, filed as application No. PCT/JP2008/060482 on Mar. 18, 2009, now Pat. No. 7,989,354 --

In the specification, column 8, line 42, please add -- 37 -- after "opening"

In the specification, column 10, line 8, please add -- 35 -- after "supply"

Signed and Sealed this
Twenty-fourth Day of September, 2013

Teresa Stanek Rea
*Deputy Director of the United States Patent and Trademark Office*